United States Patent
Zolotov et al.

(10) Patent No.: US 7,127,384 B2
(45) Date of Patent: Oct. 24, 2006

(54) FAST SIMULATION OF CIRCUITRY HAVING SOI TRANSISTORS

(75) Inventors: Vladimir P. Zolotov, Cedar Park, TX (US); Rajendran V. Panda, Round Rock, TX (US); Sergey V. Gavrilov, Moscow (RU); Alexey L. Glebov, Moskovskay Oblast (RU); Yury B. Egorov, Moscow (RU); Dmitry Y. Nadexhin, Moscow (RU)

(73) Assignee: Freescale semiconductor, Inc., Austin, TX (US)

( * ) Notice: Subject to any disclaimer, the term of this patent is extended or adjusted under 35 U.S.C. 154(b) by 678 days.

(21) Appl. No.: 10/333,432

(22) PCT Filed: Aug. 27, 2002

(86) PCT No.: PCT/RU02/00397

§ 371 (c)(1),
(2), (4) Date: Jan. 17, 2003

(87) PCT Pub. No.: WO2004/021252

PCT Pub. Date: Mar. 11, 2004

(65) Prior Publication Data

US 2004/0044510 A1    Mar. 4, 2004

(51) Int. Cl.
*G06F 17/50*    (2006.01)
(52) U.S. Cl. ........................................... 703/14
(58) Field of Classification Search ................ 703/14
See application file for complete search history.

(56) References Cited

U.S. PATENT DOCUMENTS

| | | | |
|---|---|---|---|
| 5,345,401 A | 9/1994 | Tani | |
| 5,446,676 A | 8/1995 | Huang et al. | |
| 5,553,008 A | 9/1996 | Huang et al. | |
| 5,761,481 A | 6/1998 | Kadoch et al. | |
| 5,770,881 A * | 6/1998 | Pelella et al. | 257/347 |
| 6,023,577 A | 2/2000 | Smith, III et al. | |
| 6,055,460 A | 4/2000 | Shopbell | |
| 6,141,632 A | 10/2000 | Smith, III et al. | |
| 6,249,898 B1 | 6/2001 | Koh et al. | |
| 6,268,630 B1 * | 7/2001 | Schwank et al. | 257/347 |
| 6,298,467 B1 | 10/2001 | Chuang et al. | |
| 6,397,172 B1 * | 5/2002 | Gurney | 703/14 |

(Continued)

FOREIGN PATENT DOCUMENTS

WO    WO 01/20648 A2    3/2001

OTHER PUBLICATIONS

PCT/RU02/00397 PCT Search Report mailed Apr. 10, 2003.

(Continued)

*Primary Examiner*—Paul Rodriguez
*Assistant Examiner*—Andre Pierre-Louis

(57) ABSTRACT

A fast transient simulator of SOI MOS circuits uses fast and accurate SOI transistor table models. The simulator uses a representation of a circuit with partitions. Each of partitions is simulated separately for a short time step by numerically solving differential equations describing its transient behavior. Behavior of the whole circuit is simulated in an event driven way where each event corresponds to an integration time step for each partition. Instead of body voltage, the simulator implements a transformation and uses body charge as an independent variable in order to obtain high accuracy and high speed of simulation. Construction of SOI transistor table models results in speed and accuracy enhancements. This transformation allows the reduction of the number of table dimensions exploiting the fact that SOI transistor backgate capacitance is approximately constant.

18 Claims, 15 Drawing Sheets

U.S. PATENT DOCUMENTS

| | | | |
|---|---|---|---|
| 6,442,735 B1* | 8/2002 | Joshi et al. | 716/4 |
| 6,480,816 B1* | 11/2002 | Dhar | 703/14 |
| 6,567,773 B1* | 5/2003 | Rahmat et al. | 703/14 |
| 2002/0016705 A1 | 2/2002 | Kroell et al. | |

OTHER PUBLICATIONS

Chua et al., "Computer-Aided Analysis of Electronic Circuits," Prentice-Hall, Inc., Englewood Cliffs, New Jersey, 1975, pp. 599 and English translation thereof.

Devgan et al., "Adaptively Controlled Explicit Simulation," *IEEE Transactions on Computer-Aided Design of Integrated Circuits and Systems*, Jun. 1994, vol. 13, No. 6, pp. 746-762.

Huang et al., "The Design and Implementation of PowerMill*," *International Symposium on Lower Power Design, IEEE*, 1995, pp. 105-109.

Lewis, "Device Model Approximation Using $2^N$ Trees," *IEEE Transactions on Computer-Aided Design*, Jan. 1990, vol. 9, No. 1, pp. 30-38.

Meijer, "Fast amd Smooth Highly Nonlinear Multidimensional Table Models for Device Modeling," *IEEE Transactions on Circuits and Systems*, Mar. 1990, vol. 37, No. 3, pp. 335-346.

Newton, "Techniques for the Simulation of Large-Scale Integrated Circuits," *IEEE Transactions on Circuits and Systems*, Sep. 1979, vol. CAS-26, No. 9, pp. 741-749.

Ortega et al., "Iterative Solutions of Nonlinear Equations in Several Variables," Academic Press, New York and London, 1970, pp. 211-212 and partial English translation thereof.

Pissanetzky, "Sparse Matrix Technology," Academic Press Inc., 1984, pp. 130-131 and partial English translation thereof.

Shepard, "CAD Issues for CMOS VLSI Design in SOI*," *International Symposium on Quality Electronic Design, IEEE*, 2001, pp. 105-110.

Shepard, "Body-Voltage Estimation in Digital PD-SOI Circuits and Its Application to Static Timing Analysis," *IEEE Transactions on Computer-Aided Design of Integrated Circuits and Systems*, Jul. 2001, vol. 20, No. 7, pp. 888-901.

* cited by examiner

FAST SIMULATION OF CIRCUITRY HAVING SOI TRANSISTORS

FIELD OF THE INVENTION

This invention relates generally to semiconductor modeling, and more specifically, to simulation of circuitry having silicon-on-insulator (SOI) transistors.

BACKGROUND OF THE INVENTION

Fast transient transistor simulation programs are important aids in computer aided design (CAD) of very large scale integrated (VLSI) circuits. A fast transient simulator differs from accurate circuit simulators like SPICE in its ability to simulate very large circuits at significantly higher speed, at the expense of some accuracy. Fast transient simulators provide the ability to simulate at transistor level circuits containing hundreds of thousands of transistors with high speed on the orders of hundreds time faster than accurate circuit simulators such as SPICE. The goal of fast transient simulators is to compute waveforms of voltages at circuit nodes and currents through circuit elements. Fast transient simulators are used when it is required to simulate circuits at an accuracy higher than that can be achieved by gate and switch level simulators, and with a speed higher than SPICE-like simulators.

Fast transient simulation of a Metal Oxide Semiconductor (MOS) transistor circuit usually partitions the given circuit into D.C. connected components (DCCC). Each MOSFET model is cut across its transistor gate. The interaction between partitions is simplified by considering only the dependence of MOSFET channel current on its gate voltage. Each partition is simulated independently for a short time interval called the time step. During this time interval, it is assumed that all voltages at the boundary nodes of the partition are known. Usually they are computed through linear approximation, by interpolation and extrapolation. Based on such simplifications, the behavior of each partition is simulated independently for some short time interval called a time step. Time steps can be different for different partitions and they can vary during simulation for getting the desired trade-off between speed and accuracy. The partitions that do not change their state or change it slowly are evaluated with much longer time steps. This technique improves simulation speed as compared to traditional transistor level circuit simulators like SPICE. Because of the partition mechanism and the use of different time steps, the time points at which the simulator recomputes the states of the partitions are different for each partition. The simulator arranges reevaluation of partition states in an event driven manner. The simulator plans reevaluations of partition states according to its internal processes and changes of voltages at the partition boundary. For this purpose, it uses an event queue where it schedules partitions for reevaluation. From this queue, the simulator gets partitions for reevaluation according to their time schedule.

The accurate behavior of each partition is described by a system of non-linear differential equations. One of the most accurate techniques to simulate the behavior of non-linear circuits is to use a modified nodal analysis for computing the system of equations, trapezoidal or backward Euler integration algorithm for their numerical integration, and Newton-Raphson iterations for computing voltage and current values at each time point. Such an approach is common for implementing accurate circuit simulators like SPICE. In order to get higher simulation speed, this technique is simplified in many ways. For example, the forward Euler integration algorithm can be applied, or the Newton-Raphson iterations can be substituted by approximate linearization of non-linear elements at each time point. Any type of simplification is at the cost of accuracy of the simulation results. Fast simulators differ among themselves in their selection of trade-off between speed and accuracy.

For simulating partitions, fast circuit simulators similar to traditional SPICE-like circuit simulators require a model of MOS transistors. For SPICE simulators, an accurate transistor model is specified by very complex formulae for computing currents and charges of each transistor terminal as a function of terminal voltages. Computation of these complex formulae significantly slows down circuit simulation. In order to have high simulation speed, fast transient circuit simulators usually use a simplified transistor model. The simplified transistor model can be either analytical or table-based. Analytical models are usually not accurate enough for submicron short channel MOS transistors. Table models usually are able to provide much higher accuracy with higher computation speed. In the simplest straight forward approach, a table model is a collection of tables, each of which provides values of transistor terminal currents or charges as functions of terminal voltages. The tables are usually computed by using an accurate transistor level simulator like SPICE.

The structure of a conventional bulk MOS transistor 10 is shown in FIG. 1. Transistor 10 has a substrate 12, a gate oxide 14, a gate 16, a drain 17 and a source 18. The electrical model 34 of transistor 10 is shown in FIG. 2 and has four terminals: a drain 37, a source 38, a gate 36 and a substrate 39. Therefore, a straight-forward model approach results in four charge tables and four current tables. Each of the tables has four arguments or inputs, viz. the four terminal voltages. Unfortunately, tables organized in such a manner are too large to use efficiently in any simulator. Therefore, fast transient simulators use different techniques to simplify their table models. The first simplification comes from the fact that transistor behavior does not change if we change all terminal voltages by the same value. In other words, transistor behavior is invariant to voltage shift. This simplification allows a reduction in the number of table arguments by one as one of the four terminals can be treated as a reference terminal. Other facts that are used for model simplification are charge and current conservation laws. The conservation laws make it sufficient to have models only for three terminal currents and charges and allow computation of the current and charge of the fourth terminal so that total charge and current ate zero. Unfortunately, these simplifications are not enough to make transistor models sufficiently efficient. Therefore, fast transient circuit simulators often use additional approximations for simplifying a transistor table model. For bulk MOS transistors, it is common to assume that transistor terminal capacitances are linear, meaning that they do not depend on transistor terminal voltages. This assumption permits using just average values of transistor terminal capacitances instead of a table of terminal charges as functions of terminal voltages. Currents of bulk MOS transistor table models can be simplified by ignoring substrate and gate currents as they are orders of magnitude less than transistor channel current and do not affect circuit behavior drastically. Simulators can simplify the model of bulk transistor channel current by considering the channel current as a function of two variables: (1) the voltage between drain and source and (2) the effective gate voltage. The effective gate voltage is defined as a difference between gate-to-source voltage and a threshold voltage, predetermined for each transistor. Threshold voltage is considered as a function of body voltage and may be modeled by a separate one-dimensional table. This approach follows from the simple analytical model of a bulk MOS transistor. Thus, instead of one three-dimension table for channel current, two smaller tables are used: one two-dimensional table and one single-dimensional table. Such table reduction costs some accuracy of the model. For pure digital MOS circuits, especially for CMOS circuits, the foresaid reduction still retains sufficient accuracy and allows the simulator to compute good approximation of circuit delays and power consumption. However, this model is not accurate enough for many circuits, for example circuits using many pass gates, circuits having very large D.C. connected components, and circuits that are very sensitive to accuracy, such as the PLL (Phase Locked Loop) circuits.

Additional challenge and problem for fast circuit simulation are SOI circuits that are becoming more and more popular in high speed and low power VLSI designs. The structure of an SOI MOS transistor 20 is shown in FIG. 3. An SOI transistor is similar to a bulk transistor but it is manufactured on an insulator layer and completely isolated from one to another by the same insulator. SOI transistor 20 has a substrate (backgate) 22, a buried oxide 24, a body 26, a gate oxide 27, a gate 28, a source 29, a drain 30 and a shallow trench isolation 32 around the perimeter. Because of the SOI structure, transistor capacitances are much smaller than the ones in a comparable size bulk transistor. The reduced capacitances make an SOI transistor significantly faster and reduce power consumption. Thus SOI transistors are very attractive for high performance and low power circuits. SOI transistors also have other benefits like latch-up immunity, lower radiation susceptibility, etc. Unfortunately, designing VLSI circuits with SOI transistors is more difficult than with bulk transistors because SOI transistors have more complicated behavior than bulk transistors. In bulk transistors, the fourth terminal is a VLSI substrate that is permanently connected to ground or a supply voltage $V_{DD}$. The counterpart terminal in an SOI transistor is a body that has very small capacitance and usually is not connected to any other circuit node. Because of that, the body potential (voltage) varies significantly during circuit operation due to such effects like capacitive coupling with other circuit nodes, leakage, and impact ionization currents. These effects significantly influence SOI transistor behavior by changing its threshold voltage.

Another complication with the SOI transistor model arises due to its usage with different types of body connections. The most common case, and also the most difficult to simulate, is the floating body configuration wherein the transistor body is not connected to any other circuit node. The floating body type SOI transistor configuration provides the smallest transistor area but makes its behavior less predictable. The potential of a floating body can vary due to variation in the switching frequency, thus giving rise to an effect known as the history effect. This effect makes logic gate delay depend on gate switching history. Another type of SOI MOSFET configuration has its body and source connected together that makes its behavior similar to a bulk MOS transistor. An example of this configuration is illustrated in FIG. 4 wherein a structure 50 has an SOI transistor having an n+ drain 52, a gate 54, an n+ source 56 and a p+ tie 58 to tie the body with the source 56. The third type of SOI transistor configuration has a separate body contact that can be connected to any node of the circuit. An example of this configuration is illustrated in FIG. 5 wherein a structure 60 has an SOI transistor having an n+ drain 62, an n+ source 64, a gate 66 and a p+ body contact 68. Thus, transient simulators of SOI circuits should handle all these three types of transistors.

The electrical model of an SOI transistor is shown in FIG. 6. SOI transistor 40 has five terminals as compared to four terminals of a bulk MOS transistor. Transistor 40 has a gate 42, a drain 44, a source 45, a body 46 and a backgate (substrate) 48. The additional terminal makes an SOI model significantly more complex and results in significant increase in model's table size.

Simulation of SOI circuits is more sensitive to numerical errors because the history effect has a very large characteristic time constant as compared to logic gates' switching time. Even small numerical errors in body charge computation are accumulated resulting in prediction of wrong circuit delays. Because of that, accurate transient circuit simulators simulate SOI circuits much slower than bulk circuits that makes circuit design with SOI transistors even more difficult.

BRIEF DESCRIPTION OF THE DRAWINGS

The present invention is illustrated by way of example and is not limited by the accompanying figures, in which any like reference numbers indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 7:
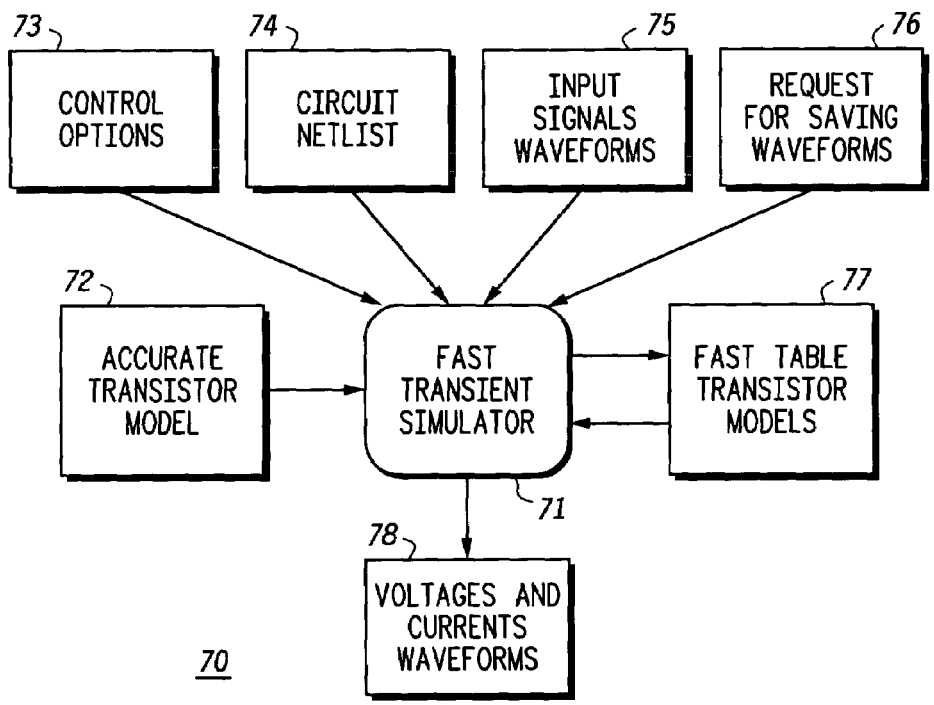
FIG. 7 illustrates a general data flow of a fast transient simulator in accordance with the present invention.

Illustrated in FIG. 7 is a general data flow of a fast transient simulator system 70 in accordance with the present invention. A fast transient simulator (FSIM) 71 has inputs connected to an accurate transistor model 72, to control options 73, to a circuit netlist 74, to input signals waveforms 75, to a request for saving waveforms 76, and to fast table transistor models 77. Fast transient simulator 71 has outputs connected to the fast table transistor models 77, and for providing voltages and currents waveforms 78. Therefore, fast transient simulator 71 input data are circuit netlist in a format such as the SPICE format, waveforms of input signals specified in the same netlist as piece-wise linear or other forms of voltage and current sources, control options setting required accuracy, and a request for saving voltage and current waveforms at different points of the circuit. Additionally, fast transient simulator 71 reads a database of fast transistor models that were prepared by it as a result of previous simulations. From this database, the fast transient simulator 71 extracts fast table models of the transistors necessary for circuit simulation. The models in the database are indexed with all the parameters of the exact SPICE transistor model. Each model corresponds to a transistor with a unique combination of all its electrical and geometrical parameters. In this way, the fast transient simulator 71 always selects the best model that models the transistor with the best possible accuracy. In case the database does not have models for some of the transistors to be simulated, the fast transient simulator 71 builds the required models before starting the simulation. The process of building the models is called transistor characterization. In order to do it, the fast transient simulator 71 loads information about accurate SPICE transistor models and use it for simulating transistor at many different voltages and computing terminal currents and charges. Using this collection of data, the fast transient simulator 71 builds several tables that describe transistor behavior and uses them for its fast simulation. The details of the transistor characterization technique are described below. All the new fast table models can be stored in a database in response to a user request for use in the future simulations. The fast transient simulator 71 has another option for creating transistor table models. It is used when very high speed of simulation is required and the circuit has many similar transistors that differ only in their widths. In this situation, the fast transient simulator 71 can compute models by linear interpolation of their current and charge tables between the tables of the existing models.

During simulation, the fast transient simulator 71 gathers information of voltage changes and current changes at the circuit points requested by a user. This information can be supplied to the user after the simulation and in the form of voltage and current waveforms.

The fast transient simulator 71 can operate in three different configurations: tightly integrated with a traditional accurate circuit SPICE simulator, integrated with any CAD tool that is required to simulate circuits, and as a stand-alone program.

Figure 8:
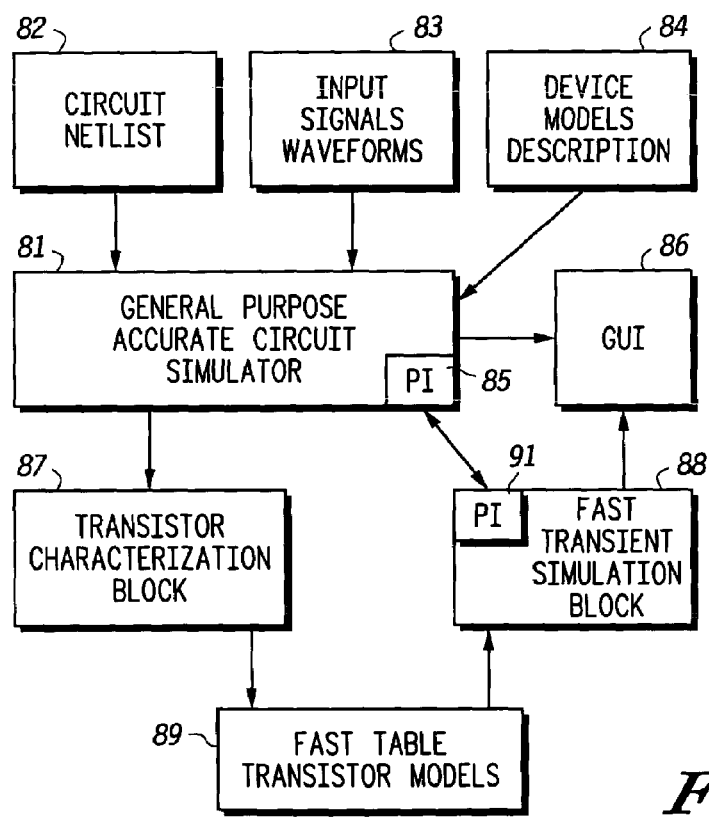
FIG. 8 illustrates a fast transient simulator integrated with a general purpose accurate transient simulator in accordance with the present invention.

The configuration of fast transient simulator 71 when tightly integrated with a general purpose accurate circuit simulator is shown in FIG. 8. A general purpose accurate circuit simulator 81 receives inputs from a circuit netlist 82, from input signals waveforms 83, from device models description 84 and from a fast transient simulation block 88. The general purpose accurate circuit simulator 81 provides output information to a transistor characterization block 87, to a fast transient simulation block 88, and to a graphical user interface (GUI) 86. The fast transient simulation block also provides an input to the GUI 86. The transistor characterization block 87 provides an output to fast table transistor models 89 that provide an input to the fast transient simulation block 88. Fast table transistor models 89 function as a data base. In this configuration, the general purpose accurate circuit simulator 81 is responsible for all communications with a user. General purpose accurate circuit simulator 81 inputs and parses the circuit netlist 82 including specification of input circuit signals in the form of piece-wise linear (PWL) voltage and current sources, or in other forms. General purpose accurate circuit simulator 81 reads a description 84 of accurate transistor models in SPICE format. In addition, the general purpose accurate circuit simulator 81 provides a Graphical User Interface (GUI) 86 for displaying circuit voltage and current waveforms. Fast transient simulation block 88 operates as a subroutine of the general purpose accurate circuit simulator 81. Fast transient simulation block 88 is invoked by one of the commands of the accurate simulator. From a user point of view, the fast transient simulation block 88 looks like a fast version of a traditional transient circuit simulation with slightly less accuracy. The fast transient simulation block 88 in this configuration communicates with the general purpose accurate circuit simulator 81 through an Application Program Interface (API) 85, 91 that excludes any unnecessary time expense for data transfer through disk files. The function of fast transient simulation is implemented by both the fast transient simulation block 88 and the transistor characterization block 87. The fast transient simulation block 88 receives a parsed circuit description from the general purpose accurate circuit simulator 81, simulates the parsed circuit description, and gathers voltage and current changes at the requested circuit points. When the amount of waveform information exceeds some predetermined limit that is the size of internal buffer space, the fast transient simulation block 88 either sends the waveform information to the general purpose accurate circuit simulator 81 for future displaying and postprocessing or writes it into a file on an external disk (not shown) in the format of the accurate general purpose circuit simulator 81 for possible displaying or postprocessing later. The fast transient simulation block 88 loads fast table transistor models 89 from its database. In the absence of the required models 89, the fast transient simulation block 88 asks the transistor characterization block 87 to build the necessary table models 89. On this request, the transistor characterization block 87 communicates with accurate device models 84 via the general purpose accurate simulator 81 requesting from it transistor terminal currents and charges as functions of its terminal voltages. Using this information, the transistor characterization block 87 creates the necessary tables and supplies them to the fast transient simulation block 88. Using the API, instead of a slow file interface as it is often used in many fast simulators, significantly decreases the time required for transistor characterization. It is especially important for SOI circuits because SOI transistors have much more independent variables than bulk transistors and their characterization requires computing an order of magnitude more data points.

Figure 9:
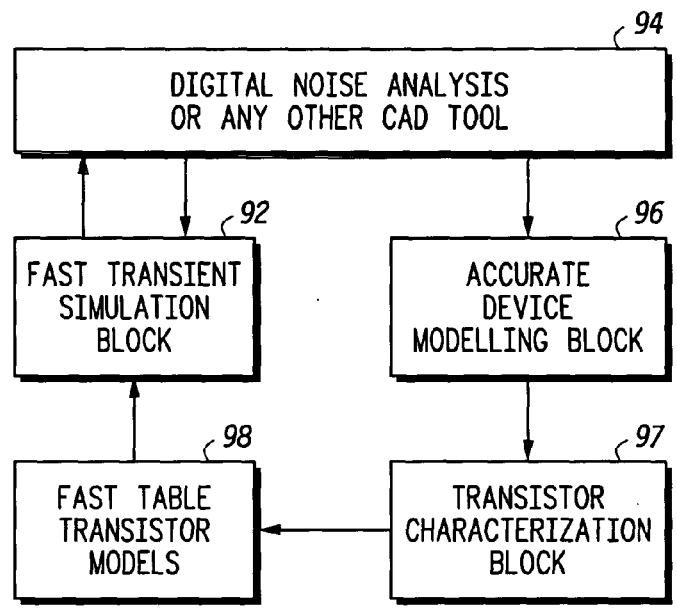
FIG. 9 illustrates a fast transient simulator integrated with a computer aided design tool in accordance with the present invention.

The fast transient simulation block has an Application Program Interface to be integrated with any other CAD tool that requires to compute transient response of SOI MOS circuits. Examples of such CAD tools may be, for example, a Noise Analysis Tool, a Timing Analysis Tool, or a Transistor Sizing Tool. The configuration where the fast transient simulation block 88 is integrated with a digital noise analysis tool is shown in FIG. 9. A digital noise analysis tool 94 interfaces with a fast transient simulation block 92, and with an accurate device modelling block 96. The accurate device modelling block 96 provides an output to a transistor characterization block 97. Transistor characterization block 97 provides an output of fast transistor table models 98 that provide data to the fast transient simulation block 92. The Noise Analysis Tool 94 uses the fast transient simulation block 92 for fast simulation of noise cluster circuits (not shown) in order to compute possible noise injected through coupling capacitance. Simulation speed is a very critical factor for Noise Analysis Tool 94 because it has to analyze a large number of nets in the entire chip. In this configuration, the Noise Analysis tool 94 is responsible for creating a circuit to be simulated and input signals for it. Together with this information, the Noise Analysis tool 94 supplies to the fast transient simulation block 92 a description of accurate transistor models. This description is used for searching for the proper fast table model in the database, or for building the required model by transistor characterization, if one is not present already. Transistors are characterized by the transistor characterization block 97 of the fast transient simulation block 92. For this purpose, the fast transient simulation block 92 includes accurate SPICE level functions of transistor models 96. Using these functions the fast transient simulation block 92 can compute all necessary points of current and charge characteristics of the transistor and then build the required fast model. The characterization process in this configuration of FIG. 9 is the same as in the case of the tight integration of FIG. 8 with the general purpose accurate circuit simulator 81. The fast transient simulation block 92 simulates the circuit provided by the digital noise analysis tool 94 and computes voltage and current waveforms at the requested time points or computes their specific characteristics like maximum, minimum, or average value of delay, signal slope, etc.

Figure 10:
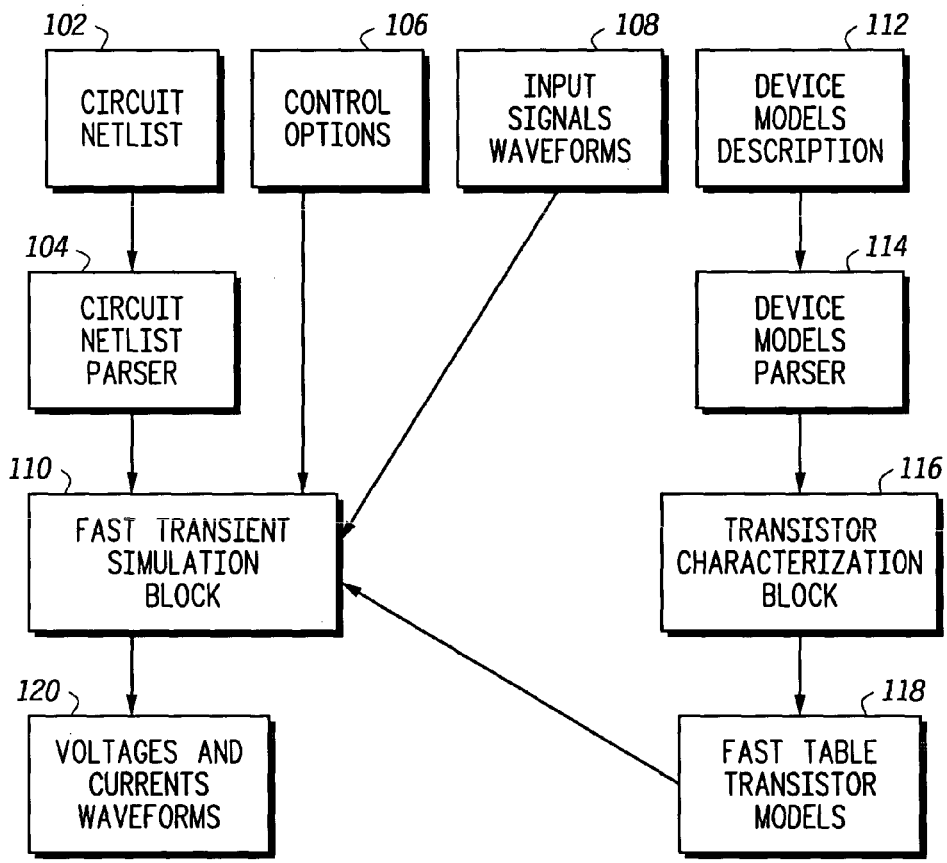
FIG. 10 illustrates a fast transient simulator in a standalone application in accordance with the present invention.

The stand-alone configuration of the fast transient simulator is shown in FIG. 10. A simulator 100 has a circuit netlist 102 that provides information to a circuit netlist parser 104. A fast transient simulation block 110 receives information from the circuit netlist parser 104, from control options 106, from input signals waveforms 108, and from fast table transistor models 118. The fast transient simulation block 110 provides voltages and currents waveforms 120. Device model descriptions 112 are provided to a device models parser 114. A transistor characterization block 116 receives information from the device models parser. The transistor characterization block 116 provides fast table transistor models 118. In simulator 100, the fast transient simulation block 110 is responsible for parsing the circuit netlist 102 specified in SPICE format together with input signal waveforms 108 as PWL voltage or current sources. The transistor characterization block 116 again includes the transistor model functions (not shown) of the general purpose SPICE level accurate circuit simulator (not shown) for all types of devices (SOI, bulk transistors, and diodes) that may be required to be characterized. Similar to the previously described operation modes, the transistor characterization block 116 significantly speeds up the transistor characterization process that is especially important for SOI circuits. Voltage waveforms and current waveforms computed during simulation are written to a file for displaying or analyzing them later.

An MOS circuit, as any other electrical circuit, is completely described by a system of differential equations. The fast transient simulator disclosed herein uses nodal equations in the following form:

$$\sum \frac{d}{dt}Q(v(t)) + \sum J(v(t)) = \sum I(t) \quad \text{(EQ 1)}$$

where:

Q(v(t)) are charges of linear (constant) or non-linear capacitances connected to a node. In the case of simulating a constant capacitance, the charge depends only on the voltage across it. In the case of simulating a transistor, the charges depend on the voltages at all the transistor terminals.

J(v(t)) are currents through the branches connected to the node. Current through resistance is expressed by Ohm's Law relating it to the voltage drop across the resistance and the value of the resistance. In the case of transistors, the currents depend on voltages at all the transistor terminals.

I(t) are currents of current sources connected to the node.

These equations simply express Kirchoff's law for the currents at the circuit nodes. The fast transient simulators of FIGS. 7, 8, 9 and 10 use a more general technique. They use modified nodal analysis for simulating circuits with self inductances, mutual inductances, and voltage or current controlled voltage and current sources. However, for fast simulation of SOI circuits, it is enough to limit the discussion to pure nodal equations.

Circuit simulation is solving these differential equations for some period of time. The number of differential equations is equal to the number of independent variables describing the circuit state and is very large. Solving such large systems of differential equations takes very long time. One of the techniques to simplify and speed up this solution is to divide the circuit into smaller partitions and solve the partitions separately. Then we deal with many smaller systems of differential equations that are much easier to solve than one large system. Unfortunately, implementing it is not easy and straight—forward since the partitions interact with each other. In order to take into account this interaction, each partition is simulated independently of the others only for a very short time interval. After that, the partitions exchange information about their state and are simulated for the next time interval. In order to improve the efficiency of this technique, it is beneficial to use for each partition as large a simulation interval as possible. For this reason, it is desirable to split the circuit into partitions that are rather independent of each other and which do not interact with each other very strongly. Another way to increase efficiency is to use for each partition its own simulation interval. Then the partitions that change their state slowly will be reevaluated less frequently than the partitions whose states are changing very fast. In order to efficiently exploit these techniques to speed up circuit simulation, it is necessary to use specific properties of MOS circuits.

Most MOS circuits can be divided into partitions that are connected with each other only through transistor gates. For transistors, two cases are possible. In the first case, a transistor completely belongs to one partition and has no connections with another one. In the other case, a transistor's gate is connected with one partition and its drain, source and body are connected to another partition. In addition, partitions can have connections through coupling capacitances. A fast transient simulator uses the fact that such partitions are usually in a stable state and the partitions change state only while switching. In most cases a partition coincides with a logic cell, but sometimes it can be much larger. For example, a large circuit block like a barrel shifter can represent just one partition, because all its transistors have connections between each other through their drain and source terminals. It is convenient to define a partition as a subcircuit, wherein between each of its nodes there exists a path for D.C. current assuming that all MOS transistors are in their "ON" state. The fast transient simulator sometimes can combine into one partition subcircuits having no D.C. path between their nodes. This is done, for example, for the purpose of obtaining higher accuracy in cases where two partitions have very tight capacitive coupling.

The fast transient simulator of each of FIGS. 7, 8, 9 and 10 simulates each partition separately for a period of time short enough to use approximated extrapolated voltages, currents, and charges incoming from other partitions.

Figure 11:
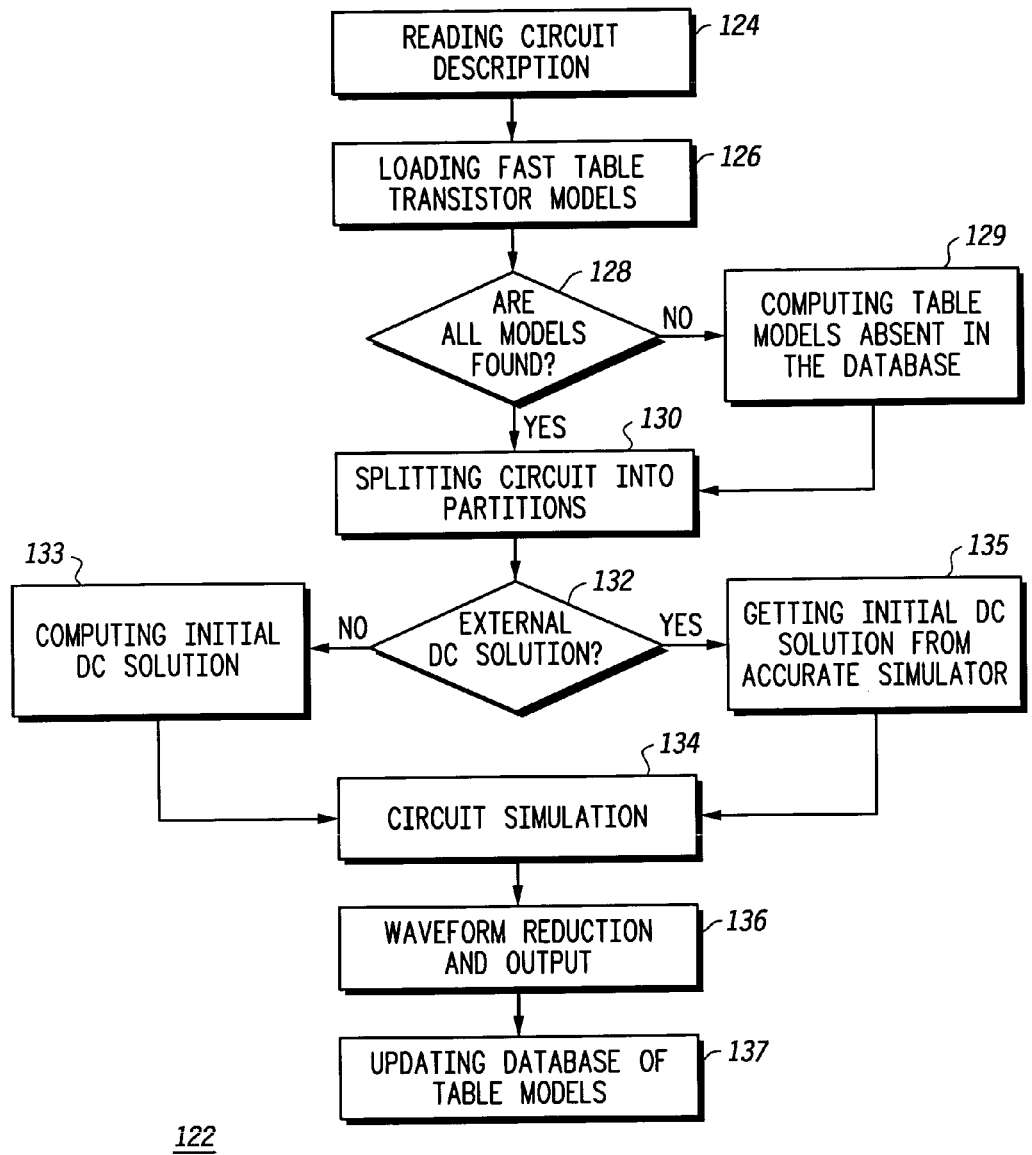
FIG. 11 illustrates a method for fast transient circuit simulation in accordance with the present invention.

The general simulation procedure implemented into the fast transient simulator of FIGS. 7, 8, 9 and 10 is depicted in FIG. 11. In a step 124, a circuit description is read. In a step 126, table based transistor models are loaded from a data base into a main memory (not shown). In a step 128, a check is made to determine whether all models that are required are found. If not, additional models are computed for any absent table models in a step 129. Once all models are found or computed, the circuit is split into partitions in a step 130. In a step 132, a determination is made as to how a user has requested to compute an initial D.C. state of the circuit. In order to start simulation, an initial state must be computed. The initial state may be computed either by the general purpose accurate simulator 81 or by the fast transient simulation block 88. In response to step 132, either step 133 or step 135 is performed to obtain the initial D.C. solution of circuit state. In step 134, the circuit simulation is performed. During the simulation, the fast transient simulation block 88 accumulates user required voltage and current waveforms. Then it compresses waveforms and either sends them to the general purpose accurate circuit simulator 81 or some CAD tool 94 requiring fast transient circuit simulation capability with which it is integrated or writes them into a file. Before sending waveforms or writing them into a file they are compressed in a step 136 in order to decrease the amount of memory required for storing them. The data is output and in step 137 the database of table models is updated.

The fast transient simulator of FIGS. 7, 8, 9 and 10 uses the following rules to break a circuit into partitions. Two circuit nodes are included into the same partition if:
  they are connected with a resistor, an inductance, or an ungrounded (floating) voltage source
  one of them is connected to the drain and the other to the source of the same MOS transistor
  they are connected through coupling capacitance that is larger than some predefined value
  both are connected to the same linear or non-linear voltage or current controlled current source.

For building partitions, the fast transient simulator uses the following rules:
  If all the terminal nodes of a device belong to the same partition, it is included only in this partition.
  If an MOS transistor belongs to two partitions, then its model is cut across the gate, and the two parts are respectively included into the partition it is connected with. Additionally, the gate-source and gate-drain capacitances are included into both partitions simultaneously.
  If a coupling capacitor is connected to two partitions and its value is lower than a predetermined limit, it is replaced with two grounded capacitors each of which is included in one of the partitions.
  If a coupling capacitor is connected to two partitions and its value is between two predetermined limits, the capacitor is included into both partitions and is considered as bidirectional terminal of each partition.
  Grounded independent (non-controlled) voltage sources are not included into any partition.
  A dependent (voltage or current controlled) grounded voltage source (linear or non-linear) is not included in any partition. Its output terminal that is a non-grounded terminal is considered to be an input terminal of the partition which it is connected to.

Circuit partitioning can be controlled by a user explicitly when the user specifies subcircuits that should be considered as one partition. This technique provides the possibility to specify subcircuits that are very susceptible to simulation errors if simulated in separate partitions. Additionally, the fast transient simulator 71 of FIG. 7 can simulate a circuit as a whole entity without breaking the circuit into separate partitions. For some critical circuits like PLLs, this method can significantly increase simulation accuracy at the expense of some simulation speed.

The fast transient simulator 71 of FIG. 7 considers each partition as a single entity and simulates the partition's transient behavior by solving a system of non-linear differential equations describing the partition's behavior. The fast transient simulator 71 simulates each partition separately only for a predetermined time interval that coincides with an integration step (to be described below in connection with FIG. 12) of the numerical procedure for integrating the system of differential equations. The integration step should be short enough in time to provide acceptable error from the point of view of both the simulated partition and other partitions directly connected to it.

The whole circuit is considered as a set of interacting partitions and simulated in an event driven manner. The simulation events are separate simulations of each partition for one integration step. The events are associated with circuit partitions, but not with separate transistors, capacitors or other devices. The integration step can be different for each partition and can vary during simulation. During simulation of a partition, it is assumed that voltages and currents at the nodes of the neighboring partitions can be linearly approximated (interpolated or extrapolated). This approximation does not assume that incoming signals are stable but treats them as varying linearly. The assumption that the incoming signals are stable that is made in some fast simulators may not be very accurate because the assumption does not allow simulation of capacitive coupling between partitions.

In general, the goal of event driven simulation is to arrange in time the simulations of partitions so that they interact with each other in a proper way. In order to accomplish this goal, an event driven simulation algorithm organizes and keeps an event queue in which future events are ordered according to the time at which they are scheduled. There are many known efficient data structures for organizing event queues, such as a time wheel. The simulation algorithm selects the earliest event from the queue, increments the simulation time up to the time of the selected event, and asks a partition simulator to compute its current state by electrical simulation, i.e. solving non-linear differential equations. A partition simulator computes the state (voltages and currents) of the partition and predicts the current and voltage values of the next event for the simulated partition. An event driven simulator that is separate from the partition simulator uses this value to schedule the next event for partition simulation. Additionally, for each node of the simulated partition that has connection with any other partition, the event driven simulator checks the criteria that the node voltage change is large enough to require the simulation of other partitions connected with this node. If the criteria is satisfied, the event driven simulator schedules immediate events for all the partitions connected to this node.

Figure 12:
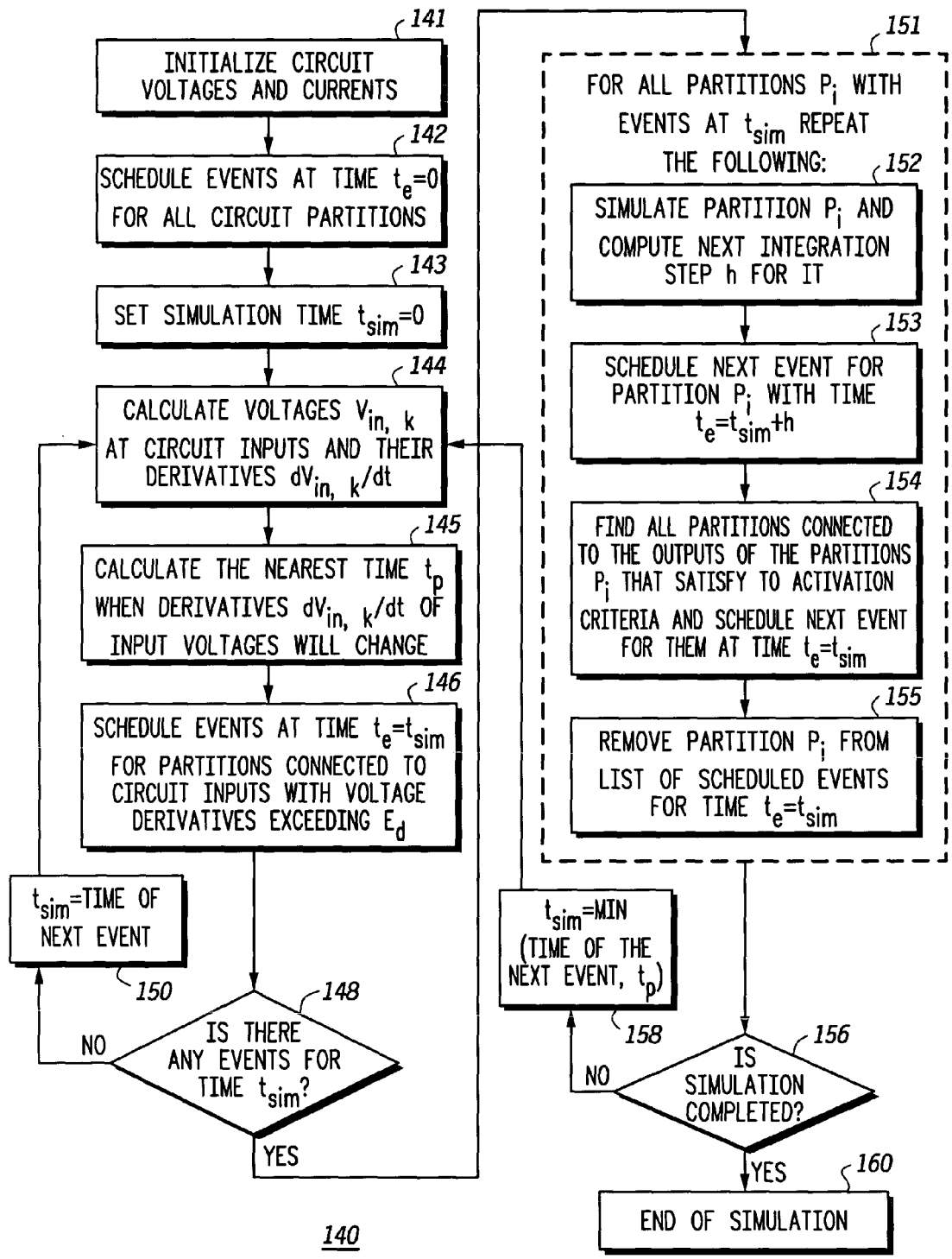
FIG. 12 illustrates a method for event driven simulation in accordance with the present invention.

The flow chart of an event driven simulation method 140 is shown in FIG. 12 for implementing the event driven mechanism that is explained above. After circuit initialization in a step 141, the method 140 schedules in a step 142 events for all partitions at time 0 in order to check possible non-stable states of the partitions due to input signal changes or unstable user defined initial conditions. Then the method 140 sets the simulation time to 0 in a step 143 and starts in a step 144 a simulation loop having either steps 145, 146, 148 and 150 or steps 145, 146, 148, steps 151, 156 and 158. In steps 144 and 145 of the loop, voltages and their derivatives are computed and checked at circuit inputs and the nearest time $t_p$ when the derivatives will change is computed. The change of input voltage derivatives is an important event for partition simulation because the change definitely affects their behavior creating a need to recompute their state at that time. Within step 146 all the inputs where voltages change fast enough (derivatives exceeding a predetermined value $E_d$) are found and events for the partitions connected to these inputs are scheduled at the current simulation time. In a step 148, a check is made to determine whether there are any events scheduled for the current simulation time. If there are no further events for the current simulation time, then a step 150 computes a new simulation time, $t_{sim}$, equal to the nearest event from the queue (not shown).

If there are further events for the current simulation time, then all such events of the corresponding partitions associated are processed in the group of steps 151. For each of these events the corresponding partition is simulated in a step 152, its next integration step h is computed in step 152 and the future event for the time $t_{sim}$+h is scheduled in a step 153. After that, all nodes of the simulated partition common with other partitions are checked for the criterion of activation of the neighboring partitions. If the criterion is satisfied, the events for all the neighboring partitions are scheduled at the current simulation time in a step 154. The scheduling allows the method to catch all possible interactions between partitions and propagate them to other partitions. After processing all the events scheduled to the current time, the method then checks in a step 156 if it has simulated all the required time interval and then completes the simulation in a step 160. Otherwise, a step 158 is executed to select the earliest event from the event queue (not shown), set the simulation time equal to the smallest of either its time $t_e$ or the time $t_p$ of the next change of input voltage derivatives. In response to completing step 158, the steps 144, 145, 146 and 148 of the simulation loop are repeated again.

According to method 140, there are two types of activity related to circuit partitions. In the first type of activity, each recomputation of the partition's state results in scheduling the partition for a next recomputation in time equal to the predicted integration step h. Therefore, partitions are always active and always are scheduled for the next simulation. The frequency of recomputation can be different for different partitions and the frequency changes during simulation for each partition individually. The frequency of a partition recomputation depends on how fast or slow the processes in the partitions are.

The second type of activity related to circuit partitions is the activation of partitions by other partitions. If the output of the partition changes its state significantly enough, all the neighboring partitions should be recomputed to respond to the changed state in a timely manner. This activation occurs immediately as a result of partition recomputation. The following two criteria are used for activation of a partition connected to the partition that changed its state:

When the Voltage derivative, dv/dt, at an input of the partition exceeds a predefined value, $E_d$, results in a partition always being resimulated.

When the Voltage change at an input of the partition since its latest simulation exceeds another predefined value.

Figure 13:
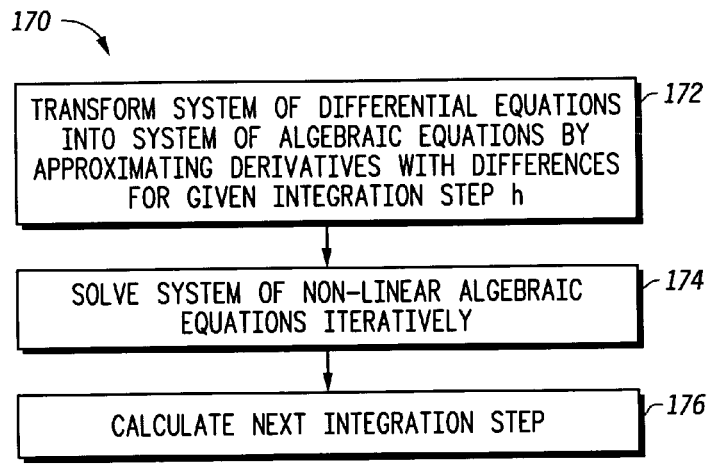
FIG. 13 illustrates a method for simulating one partition of a circuit having multiple SOI transistors for one time step in accordance with the present invention.

The behavior of circuit partitions is described by a system of non-linear differential equations of the first order:

$$f_i\left(v, \frac{dv}{dt}, V(t)\right) = 0 \qquad (EQ\ 2)$$

where v is a vector of all unknown voltages of the partition, V is a vector of the partition's input voltages, and i refers to the index of the equation. Thus the circuit partitions are simulated at each time interval of the integration step by solving this system of equations. The general methodology of this simulation is shown in FIG. 13. Fast transient simulator 71 uses a combination of backward Euler and trapezoidal integration algorithms for solving these differential equations. Prior to a step 172, an integration algorithm is chosen according to an estimation of truncation error. For inductive circuits, the fast transient simulator 71 preferably uses a trapezoidal integration algorithm because the backward Euler algorithm suppresses oscillations that could occur in inductive circuits.

For simplicity herein, this discussion is limited to the approach based on the backward Euler integration. It should be noted however that the implementation of a trapezoidal algorithm in the fast transient simulator 71 is similar to backward Euler algorithm.

In a step 172, a transformation of differential equations into a system of algebraic equations is peformed. According to the backward Euler algorithm, the transformation from differential equations to algebraic equations is done by the following approximation of derivatives:

$$\frac{dv}{dt} = \frac{v_{k+1} - v_k}{h_{k+1}} \qquad (EQ\ 3)$$

where:

$v_{k+1}$ is the voltage at the end of a simulation interval. It is our new unknown voltage value.

$v_k$ is the voltage at the beginning of the simulation interval. It is computed in the previous simulation step.

$h_{k+1}$ is the length of the simulation interval.

After substitution of equation three for derivatives into equation two, we have a system of algebraic equations:

$$F_j(v_{k+1}, v_k, V(t_k+h_{k+1})) = 0 \qquad (EQ\ 4)$$

where:

$V_{k+1}$ is the partition voltage vector at the end of the simulation interval. The components of this vector are unknown values and therefore must be computed by solving equation four.

$v_k$ is the partition voltage vector at the beginning of the simulation interval. This partition voltage was computed in the previous simulation step.

$V(t_k+h_{k+1})$ is the vector of partition input voltages at time $t_k+h_{k+1}$. The components of this vector are either the circuit input voltages or output voltages of the neighboring partitions. The values of the circuit input voltages are known and can be accurately computed for any time point during the simulation. The voltages coming from the other partitions are known for some time points up to $t_k+h_{k+1}$ from earlier simulations. For time point $t_k+h_{k+1}$ the voltages are known only in some cases if the partition was simulated earlier than this one. Therefore, we have to use extrapolation to compute this voltage.

The resulting system of non-linear equations describes the state of the partition at the time point $t_k+h_{k+1}$. For solving the resulting system, fast transient simulator 71 applies different techniques depending on particular properties of the partition as described below. The result of the solution provided by the fast transient simulator 71 has values of voltages at the partition nodes at the current time point $t_k+h_{k+1}$. Fast transient simulator 71 uses the voltage values for simulation of other partitions, for computing values of currents and for constructing waveforms of the requested voltages and currents.

At the final stage of partition simulation, the fast transient simulator 71 computes the estimation of its next integration step h. Fast transient simulator 71 needs the estimation value for scheduling a next event for this partition. The estimation value of the next integration step is computed according to the following criteria:

The error of integrating differential equations describing partition behavior does not exceed yet another predetermined value. This criteria is selected so that the integration step is small enough to obtain sufficiently small integration error. Thus the integration step $h_{k+1}$ is computed by the following equation:

$$h_{k+1} = h_k \cdot \left(\frac{e_i}{E_k}\right)^{1/N} \qquad (EQ\ 5)$$

where

N is the integration order, $e_i$ is the required local integration error, $E_k$ is an estimate (or prediction) of local integration error computed by the following equation:

$$E_k = \frac{h_k}{t_k - t_{k-N}} \cdot \|v_k - v_{extr,k}\| \qquad (EQ\ 6)$$

where:

$t_k$ and $t_{k-N}$ are the kth and (k–N)th time points $v_k$ is a vector of voltages at partition nodes at time $t_k$ $v_{extr,k}$ is a vector of predicted voltages at partition nodes at time $t_k$ calculated by the following equations:

$$v_{extr,k} = \sum_{i=1}^{N+1} g_i \cdot v_{k-i} \qquad (EQ\ 7)$$

$$g_i = \prod_{j=1, j \neq i}^{N} \frac{(t_k - t_{k-j})}{(t_{k-i} - t_{k-j})} \qquad (EQ\ 8)$$

Predicted voltage change at any output terminal of a partition does not exceed the predefined value, delta V. This criteria provides that none of the neighboring partitions misses points in time when large change of its input voltage occur. According to this condition the integration step is limited by the following value:

$$h_{k+1} = \frac{\Delta V}{dv/dt} = \Delta V \Big/ \left(\frac{v_k - v_{k-1}}{h_k}\right) \qquad (EQ\ 9)$$

The difference between voltages predicted by equations 7 and 8 does not exceed yet another predefined value. This condition provides that the integration step is not too large to cause significant deviation from the current state so that it is difficult to correctly compute the next state of the partition. The difference between two predictions of voltage values is computed by using equation 7 and equation 8 with an approximation order of N=1 and N=2. For some cases, the fast transient simulator 71 uses exponential prediction that is described below.

Figure 14:
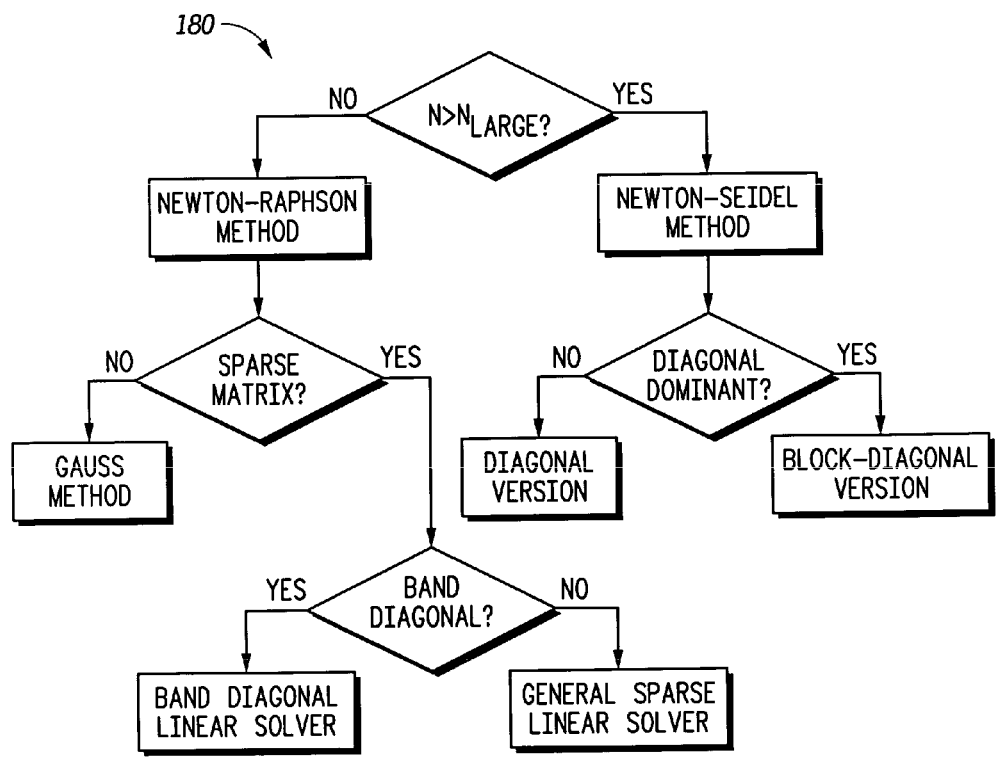
FIG. 14 illustrates a method for selecting one of multiple techniques to compute a partition state in accordance with the present invention.

The state of the partition is computed by solving the system of non-linear algebraic equations obtained from the differential equations as described above. This computation step is one of the most time consuming in the fast transient simulator 71. In order to make fast transient simulator 71 more efficient, the fast transient simulator 71 applies different techniques to partitions having different structures. The decision tree 180 for selecting the most efficient technique is shown in FIG. 14. The first decision is made depending on the number of equations. If it is not very large ($N_{large}$), then the Newton-Raphson technique is used for solving this system of non-linear equations; otherwise, a modification of the Newton-Seidel technique is applied.

The Newton-Raphson technique is a common technique used for solving non-linear systems of equations in accurate circuit simulators including many varieties of SPICE programs. This technique is an iterative algorithm that is well described in the literature. It is based on computing the next approximation $v_{i+1}$ of the solution from the previous approximation $v_i$ using Jacobian of the system by the following equations:

$$v_{i+1} = v_i - \left(\frac{\partial F}{\partial v}\right)^{-1} \cdot F(v) \quad \text{(EQ 10)}$$

$$J = \frac{\partial F}{\partial v} = \begin{bmatrix} \frac{\partial F_1}{\partial v_1} & \frac{\partial F_1}{\partial v_2} & \cdots \\ \frac{\partial F_2}{\partial v_1} & \frac{\partial F_2}{\partial v_2} & \cdots \\ \cdots & \cdots & \cdots \end{bmatrix} \quad \text{(EQ 11)}$$

This technique requires computing the inversion of the Jacobian algorithm that is reduced to solving system of linear equations. The fast transient simulator 71 uses three different techniques to solve the system of equations 10 and 11 efficiently. If the matrix of the system is dense, meaning that the ratio of the number of nonzero matrix elements to the total number is large, then the Gaussian elimination algorithm is used. If the matrix is sparse and has band diagonal structure, a conventional technique for band diagonal systems is used. Otherwise, a conventional sparse linear solver is used to solve the system of equations 10 and 11.

Figures 15, 16:
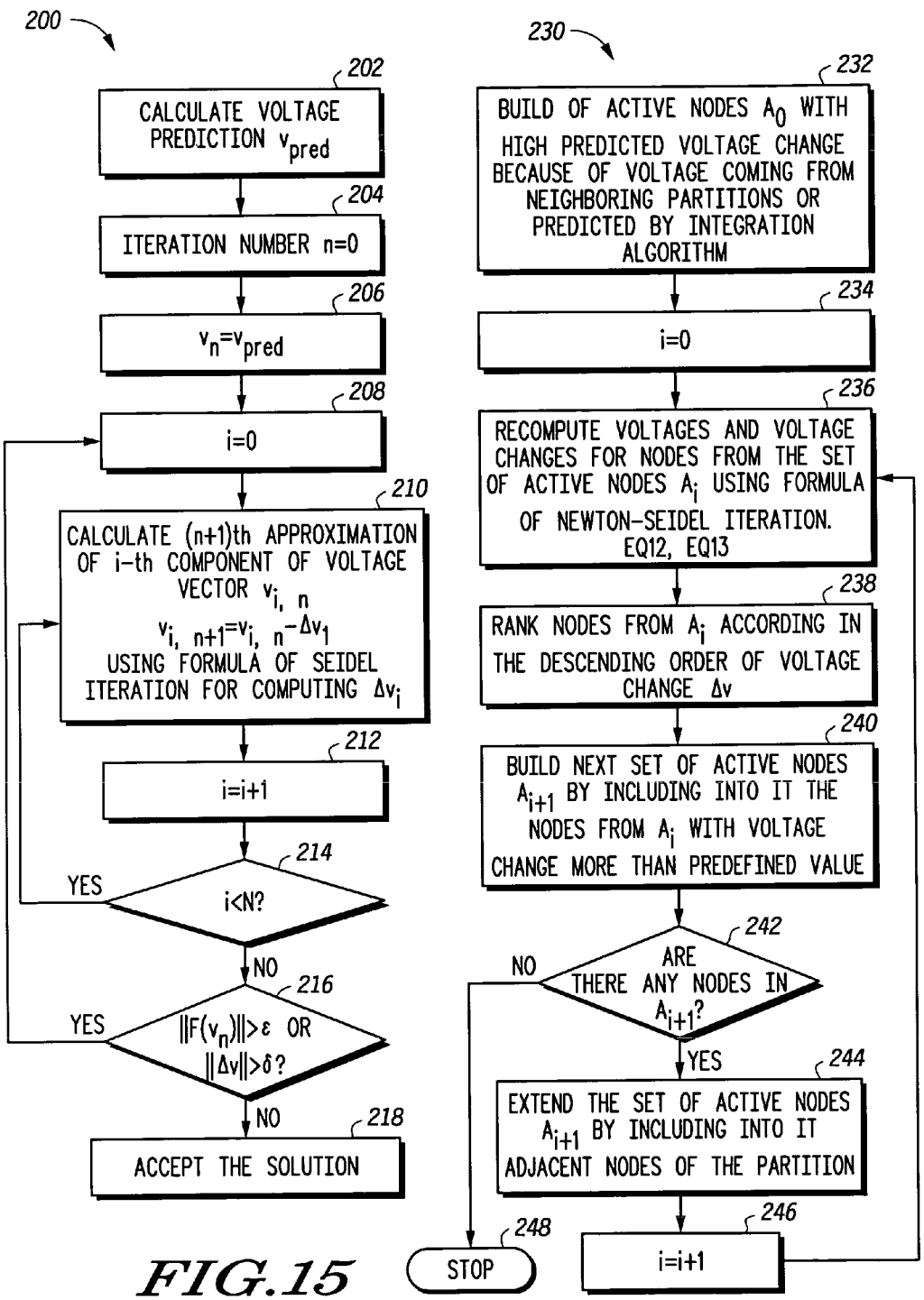
FIG. 15 illustrates a method for applying the Newton-Seidel algorithm in circuit simulators.
FIG. 16 illustrates a modification of the method of FIG. 15 to apply the Newton-Seidel algorithm to an SOI circuit simulator.

The state of the large partitions is computed by the Newton-Seidel technique that is more efficient especially if most of the transistors are in their off state. The Newton-Seidel algorithm is the algorithm for solving nonlinear algebraic equations. Its general version is depicted in FIG. 15. In a step 202, a voltage prediction value, $V_{pred}$, is calculated. In a step 204, an iteration number is initialized at zero. The algorithm has two iterative loops. In step 206, the vectors to be computed are initialized to a predicted value, $V_{pred}$. In step 208, each iteration is initialized. Steps 210, 212 and 214 enumerate the equations of the system. Step 210 solves each of the equations with respect to a variable having an index equal to the number of equations. Steps 208, 210, 212, 214 and 216 repeat the calcuation until obtaining a small enough error that is checked in a step 216. The error is checked by comparing vector norms with predetermined values. When the error is sufficiently small, the solution is accepted in a step 218. The Newton-Seidel algorithm computes the next approximation of each variable separately from the other variables by solving only one of the equations. Thus the (n+1)th approximation in the Newton-Seidel algorithm of FIG. 15 of variable $v_i$ is computed by the following equations:

$$\Delta v_{i,n+1} = \left(\frac{\partial F_i}{\partial v_i}\right)^{-1} F_i(v_{0,n+1}, \ldots, v_{i-1,n+1}, v_{i,n}, \ldots) \quad \text{(EQ 12)}$$

$$v_{i,n+1} = v_{i,n} - \Delta v_{i,n+1} \quad \text{(EQ 13)}$$

The convergence speed of the Newton-Seidel algorithm depends significantly on the order of recomputing the variables and correspondingly the order of solving the equations.

The fast transient simulator 71 uses a modified version of the Newton-Seidel algorithm 230 as illustrated in FIG. 16 to solve a system of equations that takes into account special properties of the partition and its state from which these equations were derived. Because of using nodal circuit analysis for defining circuit equations, each equation describes Kirchoff's current law of one circuit node and each variable is a value of node voltage. Instead of solving these equations by iteratively recalculating approximation of variables, fast transient simulator 71 recomputes values of node voltages using these equations. The iterative process starts with a step 232 by identifying the active nodes $A_0$ that either were predicted to have large changes of their voltages or have large voltage change incoming from neighboring partitions. In a step 234, an index of set of nodes, i, is initialized to zero. In a step 236, the fast transient simulator 71 recomputes voltages for a set of active nodes $A_i$ using the equations 12 and 13. Further, in a step 238, a ranking of nodes from the $A_i$ set of active nodes is made in a descending order of amount of voltage change at their neighboring partitions. In a step 240, a new set of active nodes, $A_{i+1}$ is built by including into the new set the nodes from the previous active set, $A_i$, having a voltage change more than yet another predefined value. In a step 242, a check is made as to whether there any nodes in a new set of active nodes, $A_{i+1}$.

If there are no new nodes in this set, the algorithm is completed and the solution is accepted in a step 248. Otherwise, in a step 244 adjacent nodes are added to the set of nodes in the new set $A_{i+1}$. In a step 246, the iteration number is incremented and a repetition of steps is performed beginning with step 236.

Working in this way, the fast transient simulator 71 propagates voltage changes through the partition graph from one node to another node giving priority to propagation of the largest changes. Method 230 increases the speed of iteration convergence. Additionally, the simulator saves time by not recomputing voltages for nodes that do not change their state. Therefore, this method 230 is much more efficient for large partitions than the general Newton-Seidel algorithm 200.

Figure 17:
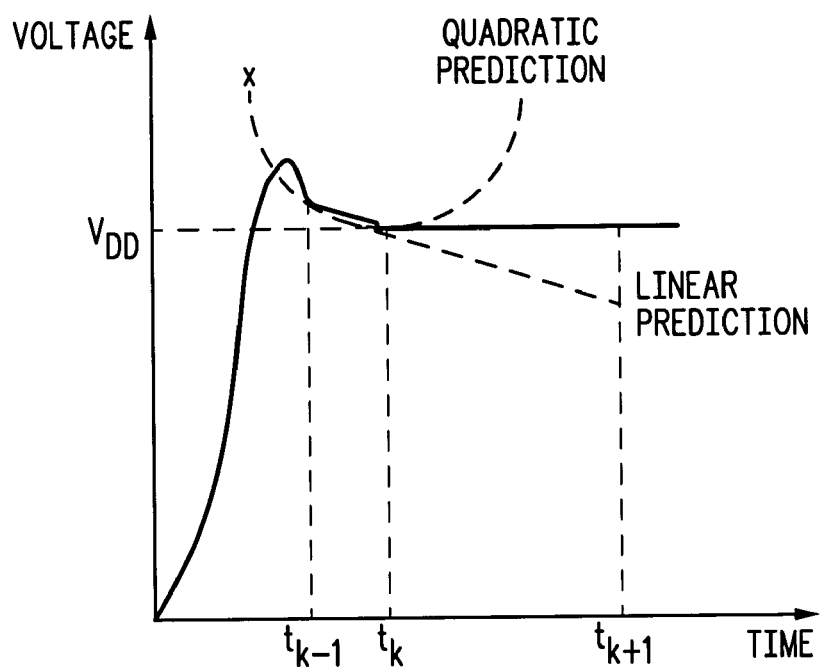
FIG. 17 illustrates a graph of voltage prediction associated with a future time point for a circuit simulator.

An important part of computing nodal voltages of a partition is starting iterations from an accurate initial approximation. This is always important for iterative techniques, including both the Newton-Raphson and the Newton-Seidel algorithms. For small time steps, fast transient simulator 71 uses traditional polynomial prediction specified by equations 7 and 8. For large time steps, such as when voltages are close to supply voltage $V_{DD}$ or ground, polynomial formulae are not accurate as it is shown in FIG. 17. Therefore, the fast transient simulator 71 uses exponential prediction by the following equations:

$$v_{k+1,pred} = V_{dd} - (V_{dd} - v_k)\exp\left(\frac{-h_k}{\tau}\right) \quad \text{(EQ 14)}$$

$$\tau = \frac{h_k}{\ln\left(\frac{V_{dd} - v_{k-2}}{V_{dd} - v_{k-1}}\right)} \quad \text{(EQ 15)}$$

Similar equations can be written for the case when any nodal voltage approaches ground potential as opposed to a supply voltage.

Differential equation 1 describing the state of circuit includes equations of SOI transistor models. The equations of an SOI trasnsitor model can be written in the following form:

$$\frac{d}{dt}Q_i(V_d, V_s, V_g, V_y, V_e) + J_i(V_d, V_s, V_g, V_y, V_e) = I_i(t) \quad \text{(EQ 16)}$$

where:

$V_i$, $J_i$ and $Q_i$ (i=d,s,g,y,e) are transistor terminal voltages, currents and charges.

These equations are used in their transformed form:

$$\sum_{k=d,s,g,y,e} \frac{\partial Q_i}{\partial V_k} \cdot \frac{dV_k}{dt} + J_i(V_d, V_s, V_g, V_y, V_e) = I_i(t) \quad \text{(EQ 17)}$$

or using terminal capacitance notations $$\sum_{k=d,s,g,y,e} C_{i,k} \cdot \frac{dV_k}{dt} + J_i(V_d, V_s, V_g, V_y, V_e) = I_i(t) \quad \text{(EQ 18)}$$

where $$C_{i,k} = \frac{\partial Q_i}{\partial V_k} \quad \text{(EQ 19)}$$

The floating body of an SOI transistor has a very small body capacitance. Therefore, its body can change its potential $V_y$ very fast due to coupling capacitance. This fast variation significantly affects accuracy of circuit differential equations due to integration errors and may require very small integration steps slowing down circuit simulation. However, the body charge $Q_y$ varies much slower. So it is better to use body charge as an independent variable instead of body voltage.

In order to have more homogeneous variables and make numerical computations more stable, we define normalized shifted body charge by the following expression:

$$U_y = V_{dd} \cdot \frac{Q_y - Q_{y\min}}{Q_{y,\max} - Q_{y,\min}} + V_e \quad \text{(EQ 20)}$$

where:

$Q_{y,min}$ and $Q_{y,max}$ are minimal and maximal body charges when body voltage changes from 0 to $V_{dd}$. It should be noted that the normalized shifted body charge may be calculated by using other voltages than $V_{dd}$ and $V_e$.

Defined in this way, the shifted normalized body charge has approximately the same range of variation as all other voltages in SOI circuits and varies much slower than the floating body voltage. This approach provides the ability to use much larger integration steps and speeds up the overall circuit simulation. Using a normalized shifted body charge does not affect the implementation of the fast simulation algorithm 71 but requires the use of tables of a transistor model with a normalized shifted body charge as an independent variable or argument and body voltage as a dependent one.

It is convenient to denote average body capacitance as:

$$C_{yy} = \frac{Q_{y\max} - Q_{y\min}}{V_{dd}} \quad \text{(EQ 21)}$$

From equations 20 and 21, we can express $Q_y$ as the following:

$$Q_y = C_{yy} \cdot (U_y - V_e) + Q_{y\min} \quad \text{(EQ 22)}$$

A change in independent and dependent variables (i.e. changing between voltage and charge) results in the need to rewrite equation 17 and the following equations are affected by transforming $V_y$ into $U_y$.

We start the transformation required when changing between using voltage and charge by separating equation 16, changing the body voltage variable, $V_y$, to a normalized body charge, $U_y$, and rewriting equation 16 as follows:

$$\frac{d}{dt}Q_i(V_d, V_s, V_g, U_y, V_e) + J_i(V_d, V_s, V_g, U_y, V_e) = I_i(t), \quad \text{(EQ 23)}$$

$$i = (d, s, g, e)$$

$$\frac{d}{dt}Q_y(V_d, V_s, V_g, U_y, V_e) + J_y(V_d, V_s, V_g, U_y, V_e) = I_y(t)$$

Transforming derivatives and substituting equation 22 for $Q_y$ we receive:

$$\sum_{k=d,s,g,e} \frac{\partial Q_i}{\partial V_k} \cdot \frac{dV_k}{dt} + \frac{\partial Q_i}{\partial U_y} \cdot \frac{dU_k}{dt} + J_i(V_d, V_s, V_g, U_y, V_e) = I_i(t), \quad \text{(EQ 24)}$$

$$i = (d, s, g, e)$$

$$C_{yy} \cdot \left(\frac{dU_y}{dt} - \frac{dV_e}{dt}\right) + J_y(V_d, V_s, V_g, U_y, V_e) = I_y(t)$$

This transformed system of equations is equivalent to the initial system of equations 17 and specifies the same behavior of an SOI transistor, but this transformed system of equations is better suited for numerical integration because the independent variable $U_y$ does not change as abruptly as $V_y$. The transformed system of equations includes derivatives of charges with respect to the new independent variable, normalized shifted body charge $U_y$. Moreover, the Newton-Raphson and Newton-Seidel techniques of computing circuit states will require computing derivatives of currents with respect to shifted body charge. All this can be done by constructing table models of an SOI transistor with a floating body using modified body charge as an independent variable.

SOI transistors with the body thereof connected to the source thereof and with the body connected to any arbitrary node of the simulated circuit do not require any change of variables. In both of these cases, the body is connected to another circuit node and is not electrically floating. Therefore, the body potential does not vary as fast as in the case of a floating body and does not create difficulties in using the body as an independent variable.

Generally, in an SOI transistor, there are five independent variables. So it is very inefficient to create a table model for a five terminal SOI transistor because it will be a five dimensional table and even if each dimension has only 10 points in total, there will be $10^5$ points to characterize. In practice, much more than 10 points in each dimension are typically required to create an accurate simulation. Therefore, simplification of the model is needed while maintaining appropriate accuracy.

A conventional approach to reduce the number of independent variables by one is to use the fact that transistor behavior does not depend on simultaneous voltage shift of all the terminal voltages by the same value. This behavior can be expressed in the following way:

$$Q_i(V_d, V_s, V_g, V_y, V_e) = Q_i(V_d + v, V_s + v, V_g + v, V_y + v, V_e + v) \quad \text{(EQ 25)}$$

$$J_i(V_d, V_s, V_g, V_y, V_e) = J_i(V_d + v, V_s + v, V_g + v, V_y + v, V_e + v)$$

Applying the conventional approach, a voltage shift value is selected to make the voltage of the source to be zero. The SOI transistor model equations can therefore be represented as:

$$Q_i(V_d, V_s, V_g, V_y, V_e) = Q_i(V_d - V_s, 0, V_g - V_s, V_y - V_s, V_e - V_s) \quad \text{(EQ 26)}$$

$$J_i(V_d, V_s, V_g, V_y, V_e) = J_i(V_d - V_s, 0, V_g - V_s, V_y - V_s, V_e - V_s)$$

As a result of the voltage shift transformation implemented in equation 26, there are only four independent variables. However, four is still too many for creating table models efficiently.

For SOI transistors we can take into account the fact that transistor currents do not depend directly on backgate voltage, $V_e$. This characteristic allows for a reduction to three variables that currents depend on. The SOI transistor model current equations are therefore shown by the following equation:

$$J_i(V_d, V_s, V_g, V_y, V_e) = J_i(V_d - V_s, 0, V_g - V_s, V_y - V_s, 0) \quad \text{(EQ 27)}$$

Now we need to simplify the model of charges. This approach is based on the fact that the capacitance from a backgate to each of the body, the drain and the source does not depend on transistor terminal voltages.

$$\frac{\partial Q_i}{\partial V_e} = C_{ie} = const \quad \text{(EQ 28)}$$

Equation 26 for a transistor terminal may be rewritten as follows:

$$Q_i(V_d, V_s, V_g, V_y, V_e) = Q_i(V_d - V_s, 0, V_g - V_s, V_y - V_s, V_e - V_s) \quad \text{(EQ 29)}$$

Using equation 29, we can transform this equation in the following way:

$$Q_i(V_d, V_s, V_g, V_y, V_e) = Q_i(V_d - V_s, 0, V_g - V_s, V_y - V_s, 0) + C_{ie} \cdot (V_e - V_s) \quad \text{(EQ 30)}$$

From equation 30 we can see that the charge on an SOI transistor terminal for any combination of its voltages can be computed from its value for the case when its source and backgate are at zero voltage potential. Thus there is a reduction in the required number of independent variables of an SOI transistor model to three variables.

In the case of transistors with the body thereof connected to the source or any other circuit node when body voltage is used as independent variable, the three independent variables of the table model are the drain, gate and body voltages. Backgate voltage is not included into the tables because currents do not depend on it and charges can be computed through equation 30 using constant capacitances between the backgate and the other transistor terminals.

The model of an SOI transistor with a floating body is more complicated because we use body charge as an independent variable and body voltage as a dependent variable. First we simplify the expression for body voltage so that it can be computed through the table with three independent variables. The equations 29 and 30 can be rewritten for body charge in the following way:

$$Q_y = f(V_d - V_s, 0, V_g - V_s, V_y - V_s, V_e - V_s) \quad \text{(EQ 31)}$$

$$Q_y = f(V_d - V_s, 0, V_g - V_s, V_y - V_s, 0) + C_{ye} \cdot (V_e - V_s) \quad \text{(EQ 32)}$$

Substituting equation 22 into equation 31 for Qy we get:

$$Q_{y\,min} + C_{yy} \cdot (U_y - V_e) = f(V_d - V_s, 0, V_g - V_s, V_y - V_s, V_e - V_s) \quad \text{(EQ 33)}$$

Solving that with respect to $V_y - V_s$ we obtain $$V_y - V_s = g(V_d - V_s, 0, V_g - V_s, U_y - V_e, V_e - V_s) \quad \text{(EQ 34)}$$

or $$V_y = V_s + g(V_d - V_s, 0, V_g - V_s, U_y - V_e, V_e - V_s) \quad \text{(EQ 35)}$$

where g is an inverse of the function f.

On the other hand, substituting equation 22 into equation 32 for $Q_y$ we get:

$$Q_{y\,min} + C_{yy} \cdot (U_y - V_e) = f(V_d - V_s, 0, V_g - V_s, V_y - V_s, 0) + C_{ye} \cdot (V_e - V_s) \quad \text{(EQ 36)}$$

or after rearrangements:

$$f(V_d - V_s, 0, V_g - V_s, V_y - V_s, 0) = Q_{y\,min} + C_{yy} \cdot (U_y - V_e) - C_{ye} \cdot (V_e - V_s) \quad \text{(EQ 37)}$$

Introducing a new variable $U'_y$ by the expression:

$$U'_y = (U_y - V_e) - \frac{C_{ye}}{C_{yy}} \cdot (V_e - V_s) \quad \text{(EQ 38)}$$

$$= (U_y - V_s) - \left(1 + \frac{C_{ye}}{C_{yy}}\right) \cdot (V_e - V_s)$$

we transform equation 37 in the following equation:

$$f(V_d - V_s, 0, V_g - V_s, V_y - V_s, 0) = Q_{y\,min} + C_{yy} \cdot (U'_y - 0) \quad \text{(EQ 39)}$$

Comparing equation 33 and equation 39 we see that equation 33 is essentially the equation 39 where $V_e = 0$ and $U_y = U'_y$. Therefore, resolving equation 39 with respect to $V_y - V_s$ we can get the following expression for $V_y$:

$$V_y = V_s + g(V_d - V_s, 0, V_g - V_s, U'_y, 0) \quad \text{(EQ 40)}$$

where:
  g is the same as in equation 35; and
  $U'_y$ is defined by equation 38.

Thus we have expressed body voltage as a function of three variables only. So it is enough to characterize the body voltage of an SOI transistor at zero voltage potential at its source and backgate voltage. Using the resulting table and equations 40 and 38, we can compute body voltage for any combinations of normalized shifted body charge and other terminal voltages.

Substituting equation 40 into equation 30 for $V_y$, we obtain the simplified equations for terminal charges of an SOI transistor with floating body:

$$Q_i(V_d, V_s, V_g, V_y, V_e) = \qquad \text{(EQ 41)}$$
$$Q_i(V_d - V_s, 0, V_g - V_s, g(V_d - V_s, 0, V_g - V_s, U'_y, 0), 0) +$$
$$C_{ye} \cdot (V_e - V_s)$$

Equation 41 shows that for computing the terminal charge for any combination of terminal voltages and body charge, it is adequate to know its value as the function of only drain and gate voltages and normalized shifted body charge.

An SOI transistor with different types of body connections have different table models.

Figure 18:
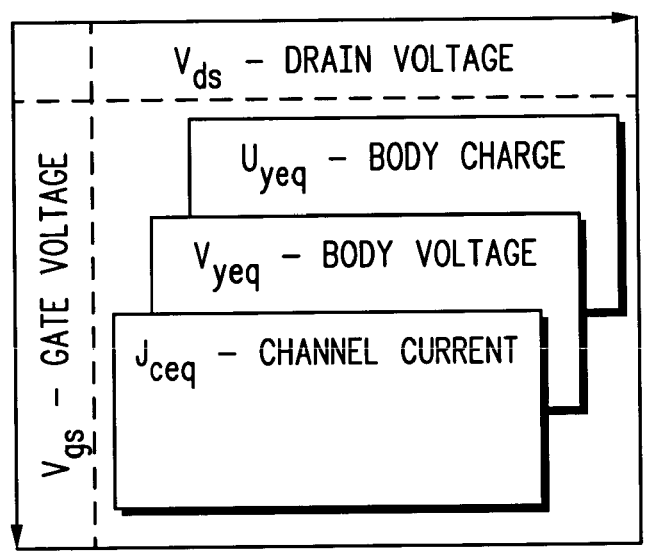
FIG. 18 illustrates a set of three two-dimensional tables related to a model of an SOI transistor in accordance with the present invention.
Figure 19:
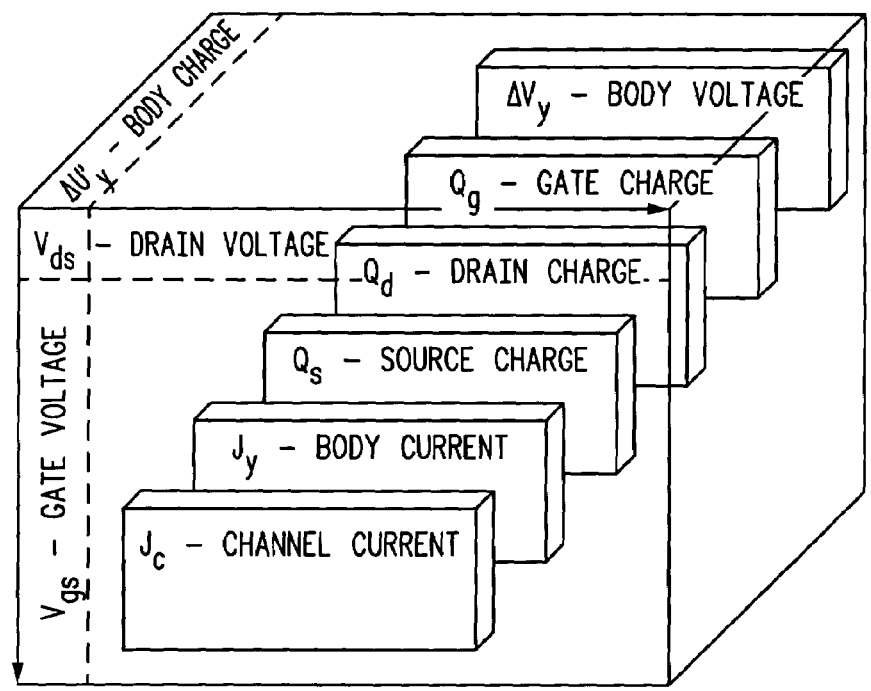
FIG. 19 illustrates a set of six three-dimensional tables related to a model of an SOI transistor in accordance with the present invention.

The model of an SOI transistor with a source tied body has the following tables:

$J_c(V_{ds}, V_{gs})$—channel current (from source to drain) as function of drain and gate voltages measured with respect to transistor source;

$Q_i(V_{ds}, V_{gs})$—source, drain, and gate charges as function of drain and gate voltages measured with respect to transistor source; and $J_{dy}(V_{dy})$—the current from drain to body as function of voltage between drain and body The model of an SOI transistor with a floating body has two tables or two sets of tables as respectively illustrated in FIG. 18 and FIG. 19. The first set of tables of FIG. 18 is a set of three two-dimensional tables that describe the channel current ($J_c$), body voltage ($V_y$) and normalized shifted body charge [$U_{yeq}=(Q_{yeq}-Q_{min})/C_{yy}$)] for the SOI transistor with its body in the equilibrium state and with $V_e$ equal to $V_s$. Each of the boxes representing $J_{ceq}$, $V_{yeq}$ and $U_{yeq}$ is a separate table respectively storing equilibrium or transistor steady-state values that are indications used to compute an appropriate $J_{ceq}$, $V_{yeq}$ or $U_{yeq}$. The arguments used to enter each of the illustrated tables are the SOI gate and drain voltages measured with respect to the source. It should be understood that each of the tables may be of varying size as will be described below.

The second set of tables is illustrated in FIG. 19 and describes transistor currents and charges in the general case used in combination with the tables of FIG. 18 for equilibrium state. The second set of tables of FIG. 19 includes six three-dimensional tables. The arguments of all six tables are drain and gate voltages ($V_{ds}$ and $V_{gs}$, respectively) measured with respect to the source, and deviation of body charge from its value in equilibrium state (Delta $U'_y=U'_y-U_{yeq}$). Each of the voltages $V_{ds}$ and $V_{gs}$ may be considered to be a relative voltage with respect to the source which is a reference terminal of the simulated SOI transistor. Three tables within the set of tables includes tables for drain, gate and source charges ($Q_s$, $Q_d$ and $Q_g$) as a function of the above argument values. Two other tables define a channel current and a body current ($J_c$ and $J_y$, respectively) as a function of the same arguments. The remaining table defines deviation of body voltage (Delta $V_y=V_y-V_{yeq}$) from its value for equilibrium transistor state as a function of the same arugments.

Splitting the SOI transistor model into two sets of tables as respectively illustrated in FIGS. 18 and 19 allows simplification of the current and charge functions and improves the accuracy of the tables. This simplification includes two aspects. Firstly, the SOI transistor model for the case of equilibrium floating body state is represented in FIG. 18 and is much simpler than the non-equilibrium case of FIG. 19. Secondly, because the non-equilibrium case is described in terms of deviations from the case of floating body equilibrium state, there is smaller variation and therefore the accuracy of the approximation is increased. The model assumes that the gate and backgate currents are zero because they are close to zero for SOI MOS transistors.

Figure 20:
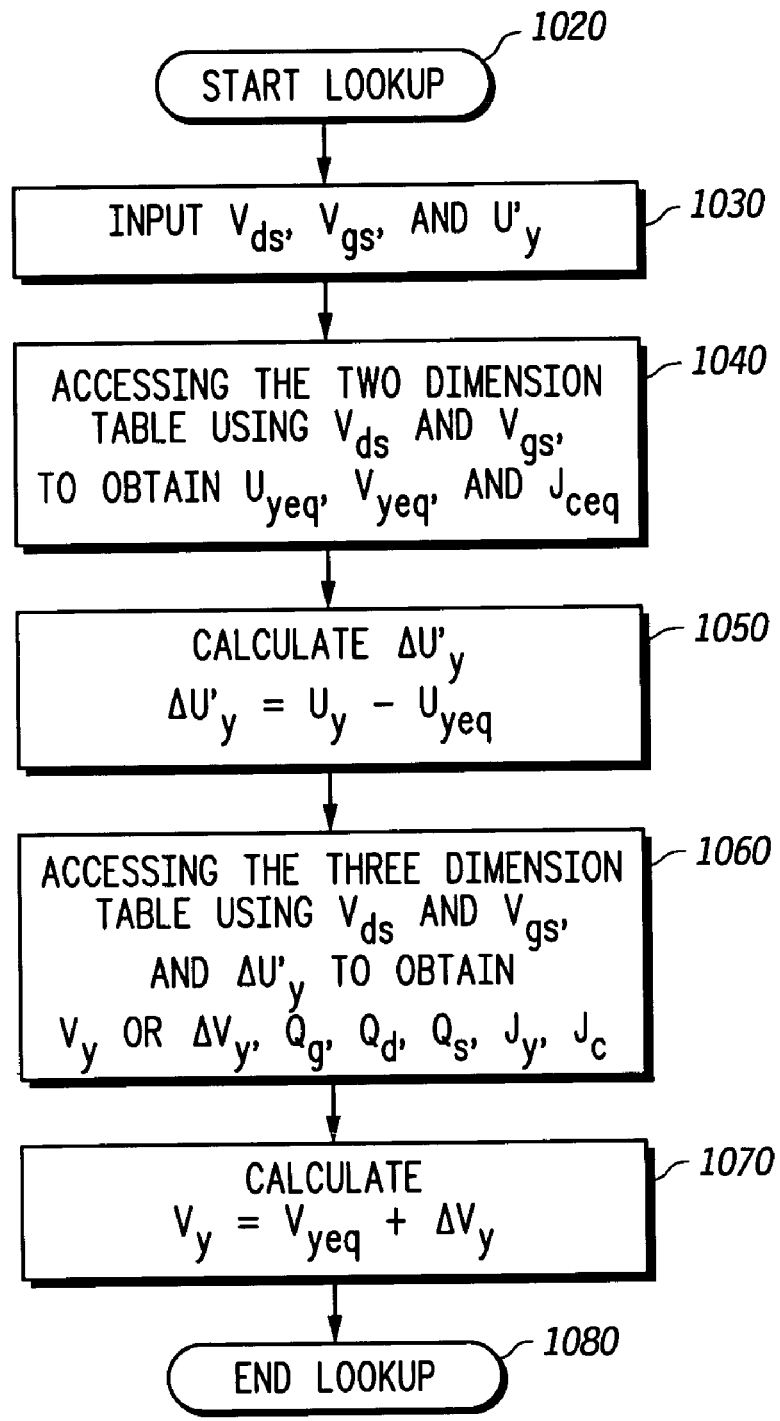
FIG. 20 illustrates a method of computing transistor voltage, current and charge values from the two sets of tables of FIGS. 18 and 19 as a function of drain and gate voltages and shifted normalized body charge of a floating body SOI transistor.

Illustrated in FIG. 20 is a method of computing the body voltage and values of floating body SOI transistor currents and charges from the two sets of tables of FIGS. 18 and 19 as functions of drain and gate voltages, $V_{ds}$ and $V_{gs}$, measured with respect to source and shifted normalized body charge, $U'_y$. The voltages $V_{ds}$ and $V_{gs}$ are respectively a first relative voltage with respect to a reference terminal of the simulated SOI transistor and a second relative voltage with respect to the reference terminal of the simulated SOI transistor. In a step 1020, a table lookup is started. In a step 1030, the voltages $V_{ds}$ and $V_{gs}$ and a normalized shifted body charge, $U'_y$, are received or obtained from input parameters. These three values form a first set of independent variables for a simulated SOI transistor. In a step 1040, the voltages $V_{ds}$ and $V_{gs}$ are used to obtain normalized shifted body charge, $U_{yeq}$, body voltage, $V_{yeq}$, and channel current, $J_{ceq}$, for the equilibrium transistor state by accessing the two dimensional tables of FIG. 18. In a step 1050, the deviation of normalized shifted body charge from its value for the equilibrium state, delta $U'_y$, is computed. In other words, delta $U'_y$ is a differential value between an equilibrium value and the value $U_y$ at equilibrium computed by equation 38. In a step 1060, the voltages $V_{ds}$ and $V_{gs}$, and the deviation of normalized shifted body charge, delta $U'_y$, are used to obtain the deviation of body voltage from the equilibrium state, delta $V_y$, or the body voltage, $V_y$ and charges of transistor gate, drain and source ($Q_g$, $Q_d$ and $Q_s$) and body and channel currents, $J_y$, $J_c$, by accessing the three dimensional tables of FIG. 19. These values represent a second set of variables. In a step 1070, the body voltage for nonequilibrium state $V_y$ is computed. In a step 1080, the table lookup ends.

Figure 21:
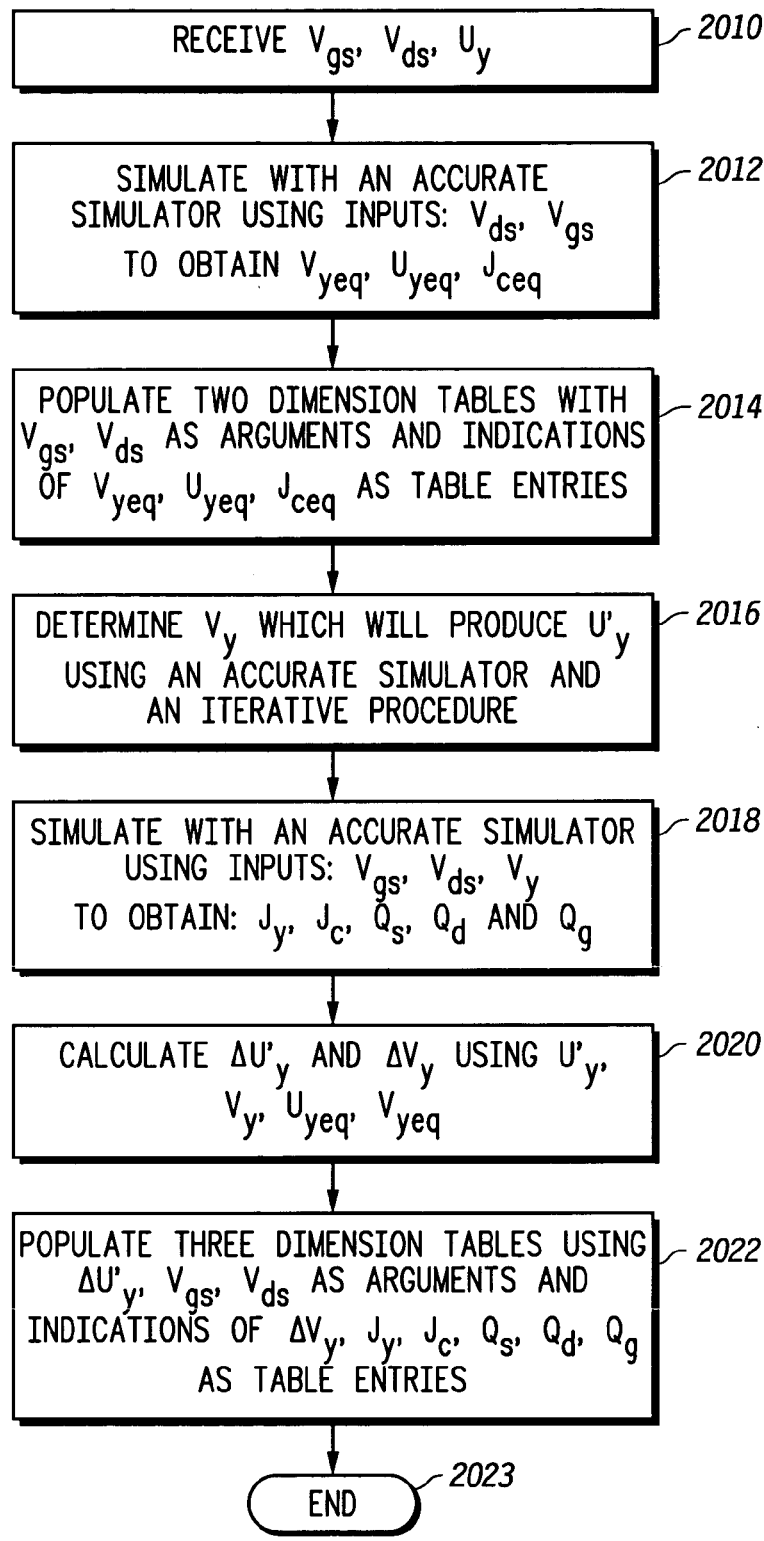
FIG. 21 illustrates a method of constructing the two sets of tables of FIGS. 18 and 19 that represent a model of a floating body SOI transistor.
Figure 22:
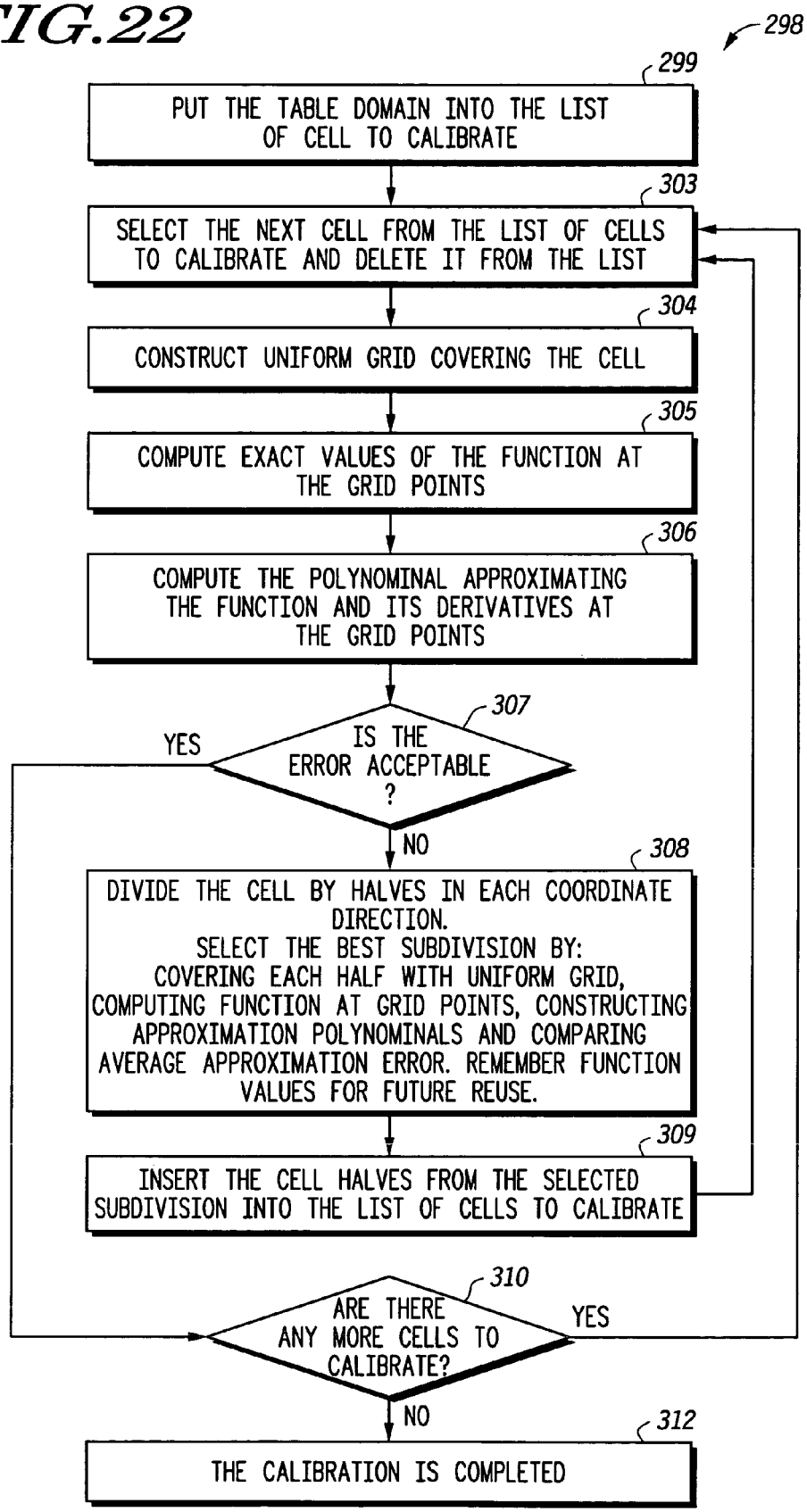
FIG. 22 illustrates a method for populating the tables of FIGS. 18 and 19 with arguments and indications.

Illustrated in FIG. 21 is a method of constructing the two sets of tables of FIGS. 18 and 19 representing a table model of a floating body SOI transistor. In a step 2010, the gate and drain voltages measured with respect to the source, $V_{gs}$ and $V_{ds}$, and normalized shifted body charge, $U'_y$, are obtained. In a step 2012, these voltages $V_{gs}$ and $V_{ds}$ are used to compute values of equilibruim state body voltage, $V_{yeq}$, equilibrium state normalized shifted body charge, $U_{yeq}$, and equilibrium state channel current, $J_{ceq}$, by using the accurate device modelling block 86 of FIG. 9 of the general purpose accurate circuit simulator 81 of FIG. 8. In a step 2014, the two dimensional table of FIG. 18 is populated with $V_{gs}$, $V_{ds}$ as arguments and an indication of $V_{yeq}$, $U_{yeq}$ and $J_{ceq}$. The procedure of populating the tables with arguments and indications is shown in FIG. 22 and described below. In this implementation, the indications referred to herein are coefficients of approximation polynomials that allows for fast computation of an approximation of functions. In step 2016, body voltage for the non-equilibrium state, VY corresponding to the given value of normalized shifted body charge, $U'_y$, is computed. Step 2016 is performed by using the general purpose accurate circuit simulator 81 of FIG. 8. The actual computation of body voltage as a function of the given body charge is performed by an iterative procedure because the general purpose accurate simulator 81 of FIG. 8 can compute only body charge as a function of body voltage. In step 2018, a computation is made of the body and channel currents, $J_y$, $J_c$, drain, source and gate charges, $Q_s$, $Q_d$ and $Q_g$, as a function of gate and drain voltages measured with respect to source, $V_{gs}$, $V_{ds}$ and body voltage, $V_y$, by using the general purpose acurate simulator 81 of FIG. 8. The deviation of normalized shifted body charge, delta $U'_y$, and the deviation of body voltage, delta $V_y$, are computed in a step 2020, from values of normalized shifted body charges, $U'_y$ and $U_{yeq}$, and body voltages, $V_y$ and $V_{yeq}$, for equilibrium and non-equilibrium transistor states. In a step 2022, the three-dimensional tables of FIG. 19 are populated using the deviation of normalized shifted body charge, delta $U'_y$, gate and drain voltages measured with respect to source, $V_{gs}$ and $V_{ds}$, as table arguments and using indications of the deviation of body voltage, delta $V_y$, body and channel currents, $J_y$ and $J_c$, and charges of source, drain and gate of the transistor, $Q_s$, $Q_d$ and $Q_g$ as table entries. The procedure of populating the tables with arguments and indications is shown in FIG. 22 and described below. In this implementation, the indications referred to herein are coefficients of approximation polynomials that allows for fast computation of an approximation of functions. In a step 2023, the method ends.

Figure 1:
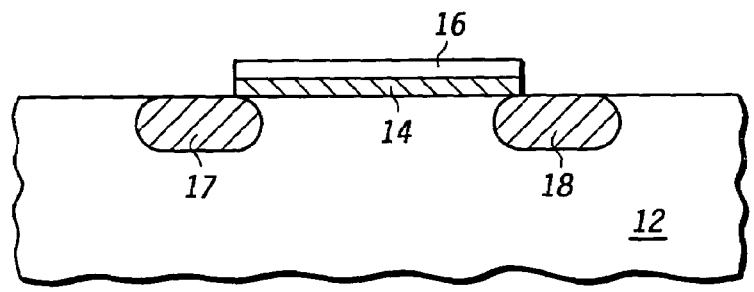
FIG. 1 illustrates in cross-sectional form a structure of a known bulk MOS transistor.
Figure 2:
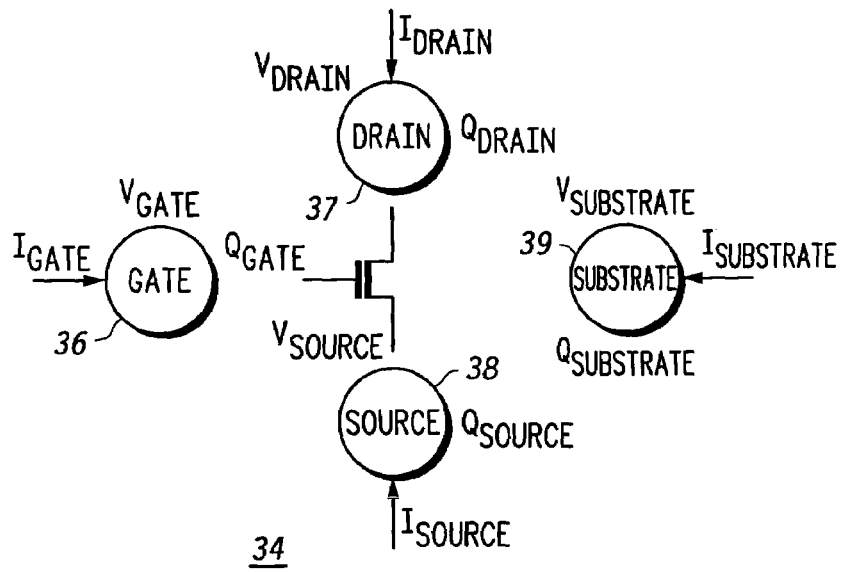
FIG. 2 illustrates in schematic form a known electrical model of the bulk MOS transistor of FIG. 1.
Figure 3:
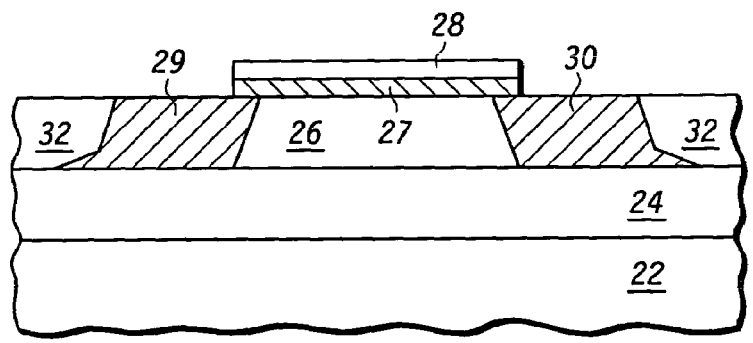
FIG. 3 illustrates in cross sectional form a structure of a known SOI transistor.
Figure 4:
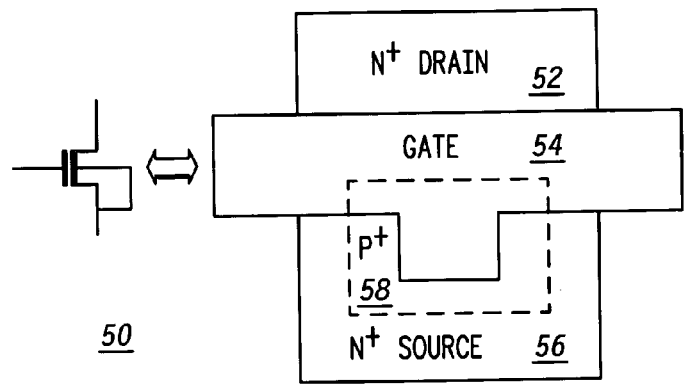
FIG. 4 illustrates in layout form a known structure of an SOI transistor with a source tied body.
Figure 5:
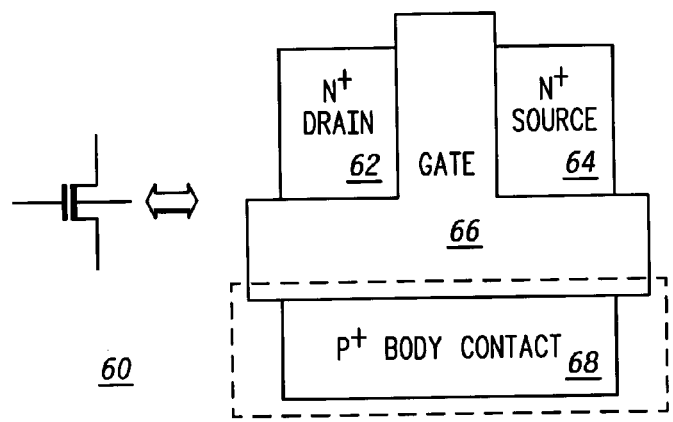
FIG. 5 illustrates in layout form a known structure of an SOI transistor with a separate body contact.
Figure 6:
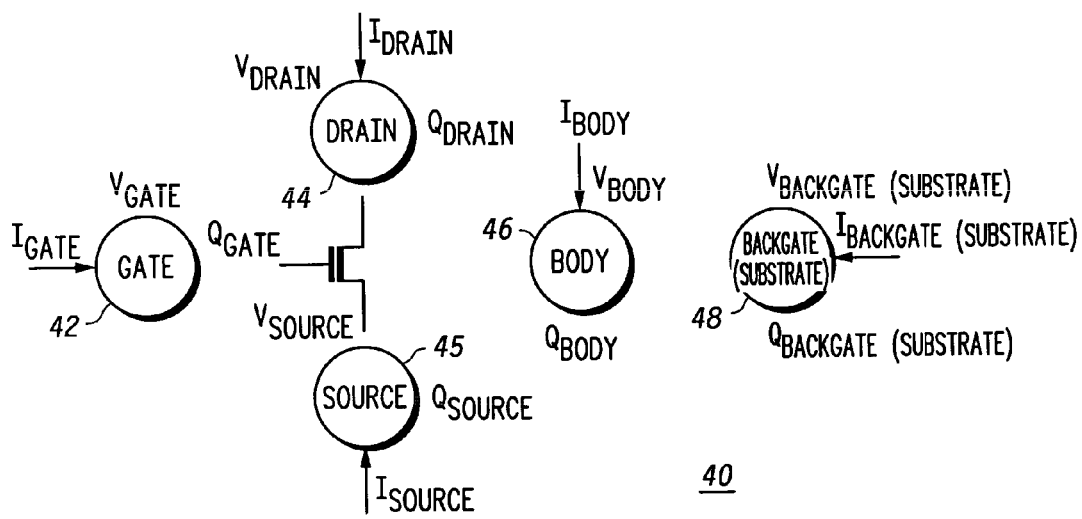
FIG. 6 illustrates in schematic form a known electrical model of the SOI transistor of FIG. 3.

As previously discussed in FIG. 6, an SOI transistor may be configured to have a body that is connected via a contact, such as the P+ body contact 68. An SOI transistor with a body that is assumed to be arbitrarily connected to any circuit node is described by the following four tables:

$J_c(V_{ds}, V_{gs}, V_{bs})$—channel current (from source to drain) as a function of drain, source and body voltages measured with respect to transistor source;

$Q_d(V_{ds}, V_{gs}, V_{bs})$—drain charge as a function of drain, source and body voltages measured with respect to transistor source;

$Q_s(V_{ds}, V_{gs}, V_{bs})$—source charge as a function of drain, source and body voltages measured with respect to transistor source; and $Q_g(V_{ds}, V_{gs}, V_{bs})$—gate charge as a function of drain, source and body voltages measured with respect to transistor source.

Figure 23:
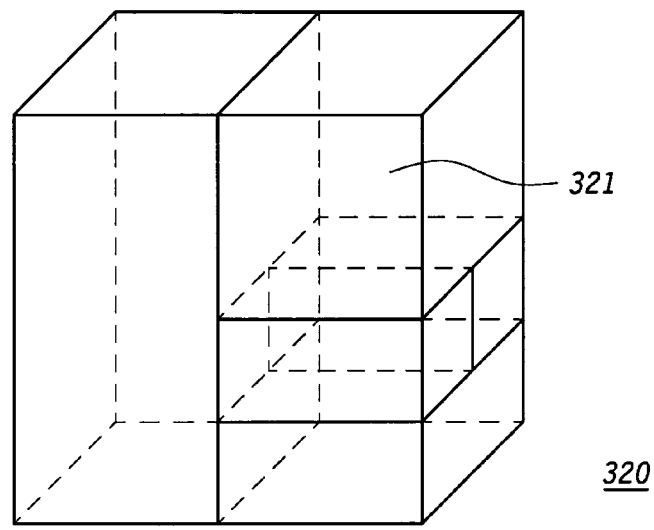
FIG. 23 illustrates in perspective form a non-uniform grid representation of the tables of FIGS. 18 and 19.

The fast transient simulator 71 of FIG. 7 uses tables with a non-uniform grid such as illustrated in FIG. 23 for a three dimensional region 320. The region 320 is a region where the function is defined by a table that is divided into rectangular cells of different sizes, such as a cell 321. Each function, such as channel current or source charge, for each cell is described by one entry of the corresponding table. For each cell, the fast transient simulator 71 uses a polynomial approximation constructed to reduce both the error in value of the function and the error in value of the function's derivative.

In the three dimensional table of FIG. 19, a function such as channel current or drain charge is approximated by a second order polynomial:

$$a_{xx}x^2 + a_{yy}y^2 + a_{zz}z^2 + a_{xy}xy + a_{xz}xz + a_{yz}yz + a_x x + a_y y + a_z z + a \quad \text{(EQ 42)}$$

Each table entry has indications for computing polynomial approximation of the function. In this implementation, these indications are simply coefficients of the above approximation polynomials.

In the two-dimensional tables of FIG. 18, a function such as channel current or body voltage is approximated by a third order polynomial:

$$a_{xxx}x^3 + a_{yyy}y^3 + a_{xxy}x^2y + a_{xyy}xy^2 + a_{xx}x^2 + a_{yy}y^2 + a_{xy}xy + a_x x + a_y y + a \quad \text{(EQ 43)}$$

Figure 24:
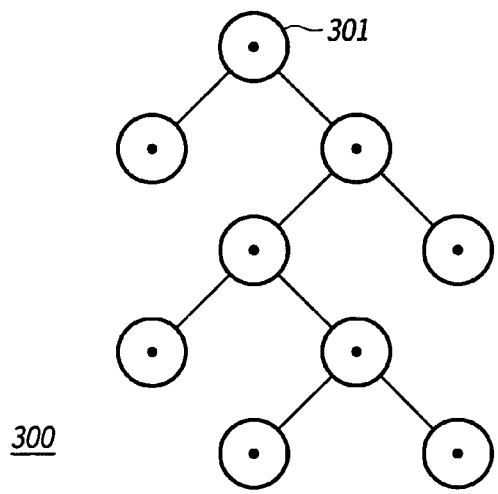
FIG. 24 illustrates in perspective form an access structure for accessing cells of the tables of FIGS. 18 and 19.
Figure 25:
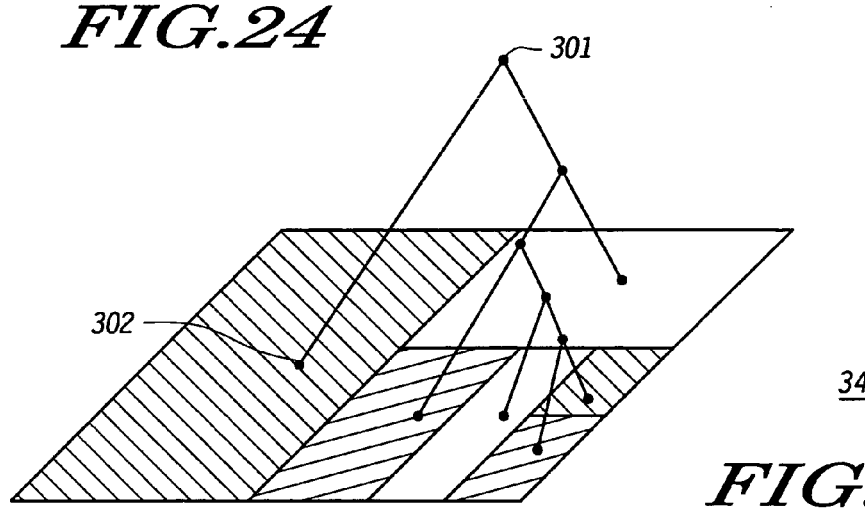
FIG. 25 illustrates in perspective form usage of the structure of FIG. 24 for accessing cells of a two dimensional region.

In order to provide fast access to the required cell of any of these tables, a tree-like binary access structure 300 as illustrated in FIG. 24 is implemented. Each table is organized as a binary tree. The tree structure 300 has a plurality of nodes, such as node 301 that functions as a root node. FIG. 25 illustrates usage of this structure 300 for accessing cells of a two dimensional region. The analysis begins with the root node 301. Each node of the tree corresponds to a rectangular region of the table domain and describes splitting the region by two equal rectangular regions along one of the coordinates. A terminal node, such as node 302 is a node that has a parent but no children. In other words, a terminal node does not extend beyond that node. The terminal nodes of the tree describe table entries that describe cells of the illustrated region. A terminal node is found by traversing the tree. Thus in order to find the required cell, the fast transient simulator 71 starts from the root 301 of the table tree and traverses it top down until a terminal node is reached. At each node the fast transient simulator 71 compares the values of the independent variables with the coordinates of the plane that splits the region and the fast transient simulator 71 selects the proper child of the current tree node.

The structure of FIG. 25 must now be built or implemented to create the SOI transistor model. This process is called a characterization or calibration of the SOI transistor model. A method 209 of performing the transistor characterization is illustrated in FIG. 22. The method begins with an assumption that the entire region (table domain) to be characterized is one cell. In a step 299, the list of cells to be calibrated is initialized by inserting only this cell into the list. In a step 303, the next cell is selected from the list of cells to calibrate and the selected cell is removed from further consideration for selection. In a step 304, a uniform grid is constructed to cover the cell. In a step 305, the exact values of the function to be approximated at the grid points are computed. In a step 306, the polynomial functions approximating the function and its derivatives at the grid points are computed. In a step 307, the approximation error is compared with some predetermined acceptable value of error. If the error is not acceptable, a step 308 is performed. The cell is divided by one-half in each coordinate direction. The best subdivision is selected by: (1) covering each half with a uniform grid; (2) computing a function at the grid points; (3) constructing approximation polynomials; and (4) computing the average approximation error. Function values are saved for future reuse in steps 305 and 306. In a step 309, the cell halves from the selected subdivision are inserted into the list of cells to be calibrated. At this point, the method returns to step 303. From this point, the method iterates the previously described steps.

If the error determined in step 307 is acceptable, a step 310 is performed. In this step, the method checks whether there are any more cells to calibrate in the list. If there are none, a step 312 determines that the characterization is complete. Otherwise, the method returns to step 303 to calibrate another cell from the list.

For three dimensional tables, the step 304 of the method of FIG. 22 uses a two-by-two-two points grid. For two dimensional tables, the step 304 of the method of FIG. 22 uses a three-by-three points grid. The coefficients of approximation polynomial of step 306 of method of FIG. 22 are computed using a linear least squares technique for fitting both function values and its derivatives. It does this by minimizing the following error function:

$$\sum \left( (f - Qs)^2 + \left( A_x \left( \frac{\partial f}{\partial x} - \frac{\partial Qs}{\partial x} \right)^2 + A_y \left( \frac{\partial f}{\partial y} - \frac{\partial Qs}{\partial y} \right)^2 + A_z \left( \frac{\partial f}{\partial z} - \frac{\partial Qs}{\partial z} \right)^2 \right) \right) \quad \text{(EQ 44)}$$

where:
  f and Qs are respectively the function to be approximated and the approximation polynomial; and
  $A_x$, $A_y$, $A_z$ are cell sizes in each dimension.
  The sum is taken for all points of the grid. Step 307 compares the error of equation 45 with the predetermined acceptable error value.

During this SOI transistor characterization, the method of FIG. 22 stores the values of the function computed at different points of the grid in order to avoid their recomputation for characterizing other cells. In order to compute the required values of the characterized function, the FIG. 22 method invokes, for example, the functions of accurate device modelling block 96 of FIG. 9.

Figure 26:
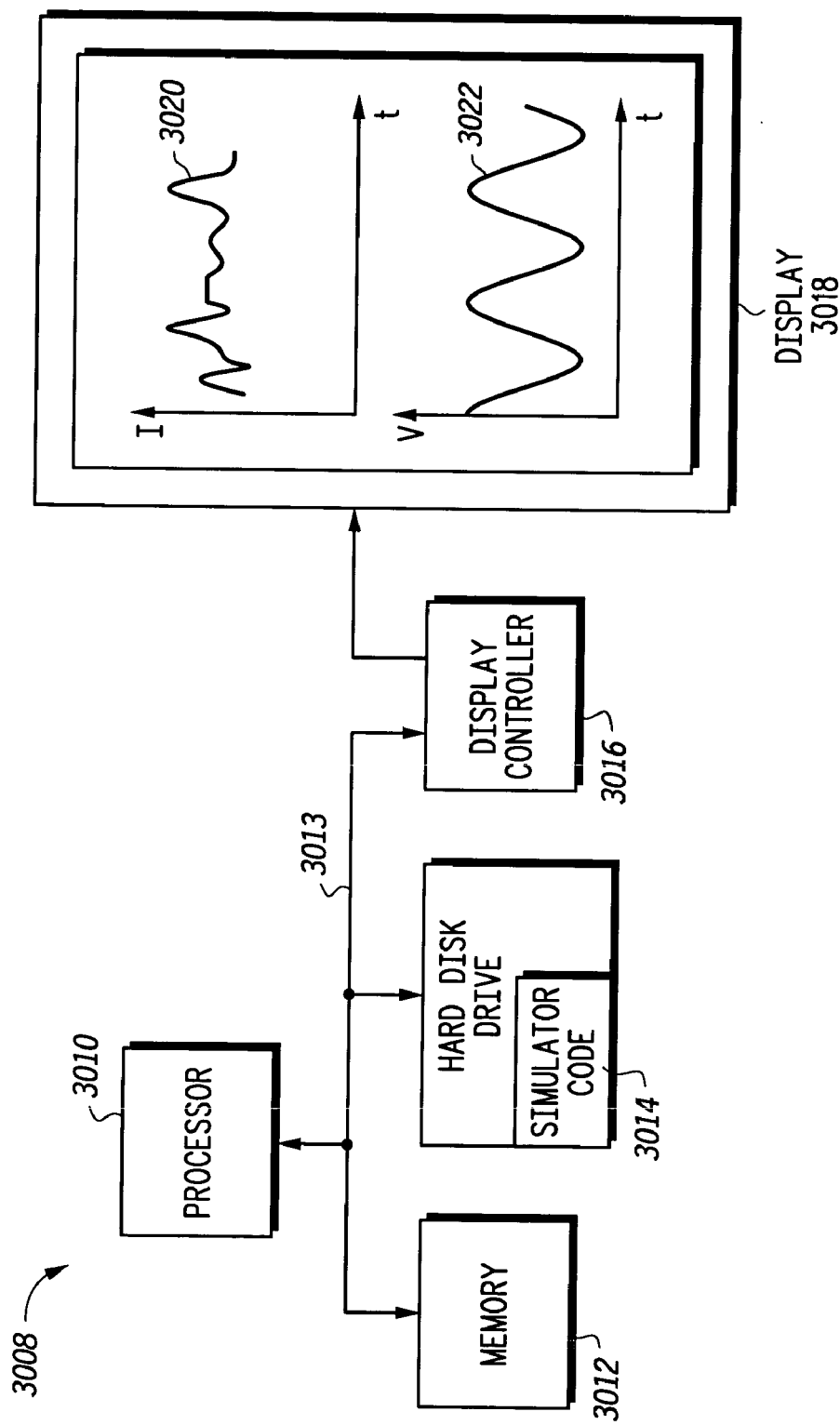
FIG. 26 illustrates in block diagram form a system that uses the simulator in accordance with the present invention.

By now it should be apparent that there has been provided a software simulator for simulating the operation and behavior of SOI transistor circuits. The simulator described herein may be used with a system 3008 as illustrated in FIG. 26. A processor 3010 is coupled to a memory 3012 and to a display controller 3016 via a bidirectional bus 3013. A hard disk drive 3014 functions as a computer readable medium and stores simulator code for implementing the software simulator and its method as described herein. Other examples of a computer readable medium include removeable media such as a compact disc ROM (CDROM), a floppy disk, random access memory (RAM), etc. A display 3018 is coupled to the display controller 3016. The display 3018 receives current and voltage values and illustrates the values as current and voltage waveforms, 3020 and 3022, as a function of time obtained by executing the simulator code with the processor 3010 for some SOI transistor circuit (not shown).

In the foregoing specification, the invention has been described with reference to specific embodiments. However, one of ordinary skill in the art appreciates that various modifications and changes can be made without departing from the scope of the present invention as set forth in the claims below. For example, the method of fast transient simulation we describe herein is implemented in a fast transient simulator (FSIM) for both SOI and bulk MOS circuits. The software simulator may be written in any programming language and for execution by any processing platform or system. The approximation polynomial described herein could readily be implemented in different form and different order. Instead of a binary tree structure used for fast access of the transistor model tables, any other structure can be used. Instead of the linear least squares fitting technique, any other approximation technique can be used. The number of uniform grid points covering the table cells may vary from that specified above.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for simulating a silicon on insulator (SOI) transistor, comprising:
  receiving a value for a drain voltage of the SOI transistor, a gate voltage of the SOI transistor, and a body charge of the SOI transistor;
  accessing a first table to obtain an equilibrium value of the body charge of the SOI transistor, an equilibrium value of a body voltage of the SOI transistor, an equilibrium value of a channel current of the SOI transistor using the drain voltage of the SOI transistor and the gate voltage of the SOI transistor;
  generating a deviation value of the body charge of the SOI transistor by comparing the body charge of the transistor with the equilibrium value of the body charge of the SOI transistor; and
  accessing a second table to obtain a body voltage of the SOI transistor, a gate charge of the SOI transistor, a drain charge of the SOI transistor, a source charge of the SOI transistor, a body current of the SOI transistor, and a channel current of the SOI transistor using the drain voltage of the SOI transistor, the gate voltage of the SOI transistor, and the deviation value of the body charge of the SOI transistor.

2. The method of claim 1 wherein the simulated SOI transistor is a floating body type SOI transistor.

3. The method of claim 1 wherein the second table is constructed by:
  simulating to obtain a set of equilibrium values for the body charge of the simulated SOI transistor;
  determining a set of values for a body voltage of the simulated SOI transistor using a set of values for the body charge, wherein the determining further includes using an iterative procedure;
  calculating a set of values for the change in body charge from the set of values for the body charge and the set of equilibrium values for the body charge; and
  populating the second table with indications of the values using at least the set of values for the change in body charge as argument values for the second table.

4. An apparatus comprising a computer readable medium storing code whose execution performs the method of claim 1.

5. The method of claim 1, wherein:
  the first table is a two dimensional table; and
  the second table is a three dimensional table.

6. A method for simulating a silicon on insulator (SOI) transistor, comprising:
  receiving a value for a drain voltage of the SOI transistor, a gate voltage of the SOI transistor, and a body charge of the SOI transistor;

accessing a first table to obtain an equilibrium value of the body charge of the SOI transistor using the drain voltage of the SOI transistor and the gate voltage of the SOI transistor;

generating a deviation value of the body charge of the SOI transistor by comparing the body charge of the transistor with the equilibrium value of the body charge of the SOI transistor; and accessing a second table to obtain a plurality of variables for the SOI transistor using the drain voltage of the SOI transistor, the gate voltage of the SOI transistor and the deviation value of the body charge of the SOI transistor.

7. The method of claim 6 wherein the simulated SOI transistor is a floating body type SOI transistor.

8. The method of claim 6 wherein the second table is constructed by:

simulating to obtain a set of equilibrium values for the body charge of the simulated SOI transistor;

determining a set of values for a body voltage of the simulated SOI transistor using a set of values for the body charge, wherein the determining further includes using an iterative procedure;

calculating a set of values for the change in body charge from the set of values for the body charge and the set of equilibrium values for the body charge; and populating the second table with indications of the values using at least the set of values for the change in body charge as argument values for the second table.

9. An apparatus comprising a computer readable medium storing code whose execution performs the method of claim 6.

10. The method of claim 6, wherein:
the first table is a two dimensional table; and
the second table is a three dimensional table.

11. A system for simulating a silicon on insulator (SOI) transistor, comprising:

means for receiving a value for a drain voltage of the SOI transistor, a gate voltage of the SOI transistor, and a body charge of the SOI transistor;

means for accessing a first table to obtain an equilibrium value of the body charge of the SOI transistor, an equilibrium value of a body voltage of the SOI transistor, an equilibrium value of a channel current of the SOI transistor using the drain voltage of the SOI transistor and the gate voltage of the SOI transistor;

means for generating a deviation value of the body charge of the SOI transistor by comparing the body charge of the transistor with the equilibrium value of the body charge of the SOI transistor; and means for accessing a second table to obtain a body voltage of the SOI transistor, a gate charge of the SOI transistor, a drain charge of the SOI transistor, a source charge of the SOI transistor, a body current of the SOI transistor, and a channel current of the SOI transistor using the drain voltage of the SOI transistor, the gate voltage of the SOI transistor, and the deviation value of the body charge of the SOI transistor.

12. The system of claim 11 wherein the simulated SOI transistor is a floating body type SOI transistor.

13. The system of claim 11 further comprising:

means for simulating to obtain a set of equilibrium values for the body charge of the simulated SOI transistor;

means for determining a set of values for a body voltage of the simulated SOI transistor using a set of values for the body charge, wherein the determining further includes using an iterative procedure;

means for calculating a set of values for the change in body charge from the set of values for the body charge and the set of equilibrium values for the body charge; and means for populating the second table with indications of the values using at least the set of values for the change in body charge as argument values for the second table.

14. The system of claim 11, wherein:
the first table is a two dimensional table; and
the second table is a three dimensional table.

15. A system for simulating a silicon on insulator (SOI) transistor, comprising:

means for receiving a value for a drain voltage of the SOI transistor, a gate voltage of the SOI transistor, and a body charge of the SOI transistor;

means for accessing a first table to obtain an equilibrium value of the body charge of the SOI transistor using the drain voltage of the SOI transistor and the gate voltage of the SOI transistor;

means for generating a deviation value of the body charge of the SOI transistor by comparing the body charge of the transistor with the equilibrium value of the body charge of the SOI transistor; and means for accessing a second table to obtain a plurality of variables for the SOI transistor using the drain voltage of the SOI transistor, the gate voltage of the SOI transistor, and the deviation value of the body charge of the SOI transistor.

16. The system of claim 15, wherein the simulated SOI transistor is a floating body type SOI transistor.

17. The system of claim 15 further comprising:

means for simulating to obtain a set of equilibrium values for the body charge of the simulated SOI transistor;

means for determining a set of values for a body voltage of the simulated SOI transistor using a set of values for the body charge, wherein the determining further includes using an iterative procedure;

means for calculating a set of values for the change in body charge from the set of values for the body charge and the set of equilibrium values for the body charge; and means for populating the second table with indications of the values using at least the set of values for the change in body charge as argument values for the second table.

18. The system of claim 15, wherein:
the first table is a two dimensional table; and
the second table is a three dimensional table.

* * * * *

UNITED STATES PATENT AND TRADEMARK OFFICE
CERTIFICATE OF CORRECTION

PATENT NO. : 7,127,384 B2 Page 1 of 1
APPLICATION NO. : 10/333432
DATED : October 24, 2006
INVENTOR(S) : Vladimir P. Zolotov It is certified that error appears in the above-identified patent and that said Letters Patent is hereby corrected as shown below:

On the Cover Page, under the "Inventors" title, Line 7:

Change "Nadexhin" to --Nadezhin--

Signed and Sealed this

Fifth Day of August, 2008

JON W. DUDAS
*Director of the United States Patent and Trademark Office*